United States Patent
Hou et al.

(10) Patent No.: US 12,125,814 B2
(45) Date of Patent: *Oct. 22, 2024

(54) BONDED ASSEMBLY CONTAINING DIFFERENT SIZE OPPOSING BONDING PADS AND METHODS OF FORMING THE SAME

(71) Applicant: SANDISK TECHNOLOGIES LLC, Addison, TX (US)

(72) Inventors: Lin Hou, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 321 days.

This patent is subject to a terminal disclaimer.

(21) Appl. No.: 17/667,238

(22) Filed: Feb. 8, 2022

(65) Prior Publication Data

US 2023/0253353 A1    Aug. 10, 2023

(51) Int. Cl.
*H01L 23/00* (2006.01)
*H01L 25/065* (2023.01)

(52) U.S. Cl.
CPC .............. *H01L 24/09* (2013.01); *H01L 24/05* (2013.01); *H01L 24/06* (2013.01); *H01L 24/08* (2013.01); *H01L 24/29* (2013.01); *H01L 24/32* (2013.01); *H01L 24/80* (2013.01); *H01L 25/0652* (2013.01); *H01L 25/0657* (2013.01); *H01L 2224/05007* (2013.01); *H01L 2224/05073* (2013.01); *H01L 2224/05565* (2013.01); *H01L 2224/05573* (2013.01); *H01L 2224/0603* (2013.01); *H01L 2224/06131* (2013.01);

(Continued)

(58) Field of Classification Search
CPC .. H01L 25/0657; H01L 25/0652; H01L 24/09
See application file for complete search history.

(56) References Cited

U.S. PATENT DOCUMENTS 10,707,228 B2    7/2020    Yu et al.
11,094,653 B2    8/2021    Wu et al.
(Continued)

FOREIGN PATENT DOCUMENTS

JP    2005-085787 A    3/2005

OTHER PUBLICATIONS

Kim, S.W. et al., "Ultra-fine Pitch 3D Integration Using Face-to-Face Hybrid Wafer Bonding Combined with a Via-Middle Through-Silicon-Via Process," 2016 IEEE 66th Electronic Components and Technology Conference (ECTC), 1179-1185; 10.1109/ECTC.2016.205.

(Continued)

*Primary Examiner* — Dale E Page
*Assistant Examiner* — Wilner Jean Baptiste
(74) *Attorney, Agent, or Firm* — THE MARBURY LAW GROUP PLLC

(57) ABSTRACT

A bonded assembly of a primary semiconductor die and a complementary semiconductor die includes first pairs of first primary bonding pads and first complementary bonding pads that are larger in area than the first primary bonding pads, and second pairs of second primary bonding pads and second complementary bonding pads that are smaller in area than the second primary bonding pads.

20 Claims, 24 Drawing Sheets

(52) U.S. Cl.
CPC ............ *H01L 2224/0801* (2013.01); *H01L 2224/08147* (2013.01); *H01L 2224/0903* (2013.01); *H01L 2224/0913* (2013.01); *H01L 2224/29187* (2013.01); *H01L 2224/29188* (2013.01); *H01L 2224/29575* (2013.01); *H01L 2224/29687* (2013.01); *H01L 2224/32145* (2013.01); *H01L 2224/80895* (2013.01); *H01L 2225/06524* (2013.01); *H01L 2225/06541* (2013.01); *H01L 2225/06548* (2013.01); *H01L 2924/1431* (2013.01); *H01L 2924/1438* (2013.01)

(56) References Cited

U.S. PATENT DOCUMENTS

| | | | |
|---|---|---|---|
| 11,145,628 B1 | 10/2021 | Sharangpani et al. | |
| 11,201,139 B2 | 12/2021 | Sharangpani et al. | |
| 11,393,780 B2* | 7/2022 | Said | H01L 25/18 |
| 2001/0007084 A1 | 7/2001 | Koo et al. | |
| 2005/0178815 A1 | 8/2005 | Blood | |
| 2007/0138628 A1 | 6/2007 | Lam | |
| 2008/0203548 A1 | 8/2008 | Sun et al. | |
| 2008/0258276 A1 | 10/2008 | Low et al. | |
| 2009/0294957 A1 | 12/2009 | Lam | |
| 2017/0040275 A1* | 2/2017 | Venkatadri | H01L 24/03 |
| 2018/0108633 A1 | 4/2018 | Park et al. | |
| 2020/0066745 A1 | 2/2020 | Yu et al. | |
| 2021/0028135 A1 | 1/2021 | Said et al. | |
| 2021/0118774 A1 | 4/2021 | Lin et al. | |
| 2021/0240227 A1 | 8/2021 | Huang | |
| 2021/0296284 A1 | 9/2021 | Sharangpani et al. | |
| 2021/0296285 A1 | 9/2021 | Sharangpani et al. | |
| 2021/0384160 A1 | 12/2021 | Oh et al. | |

OTHER PUBLICATIONS

Kim, S.W. et al., "Novel Cu/SiCN surface topography control for 1 μm pitch hybrid wafer-to-wafer bonding," *2020 IEEE 70th Electronic Components and Technology Conference (ECTC)*, 2020, pp. 216-222, doi: 10.1109/ECTC32862.2020.00046.

U.S. Appl. No. 17/118,036, filed Dec. 10, 2020, SanDisk Technologies LLC.

U.S. Appl. No. 17/167,161, filed Feb. 4, 2021, SanDisk Technologies LLC.

U.S. Appl. No. 17/317,442, filed May 11, 2021, SanDisk Technologies LLC.

U.S. Appl. No. 17/542,963, filed Dec. 6, 2021, SanDisk Technologies LLC.

Notification of Transmittal of The International Search Report and Written Opinion of the International Searching Authority for International Patent Application No. PCT/US2022/030420, mailed Nov. 7, 2022, 10 pages.

* cited by examiner

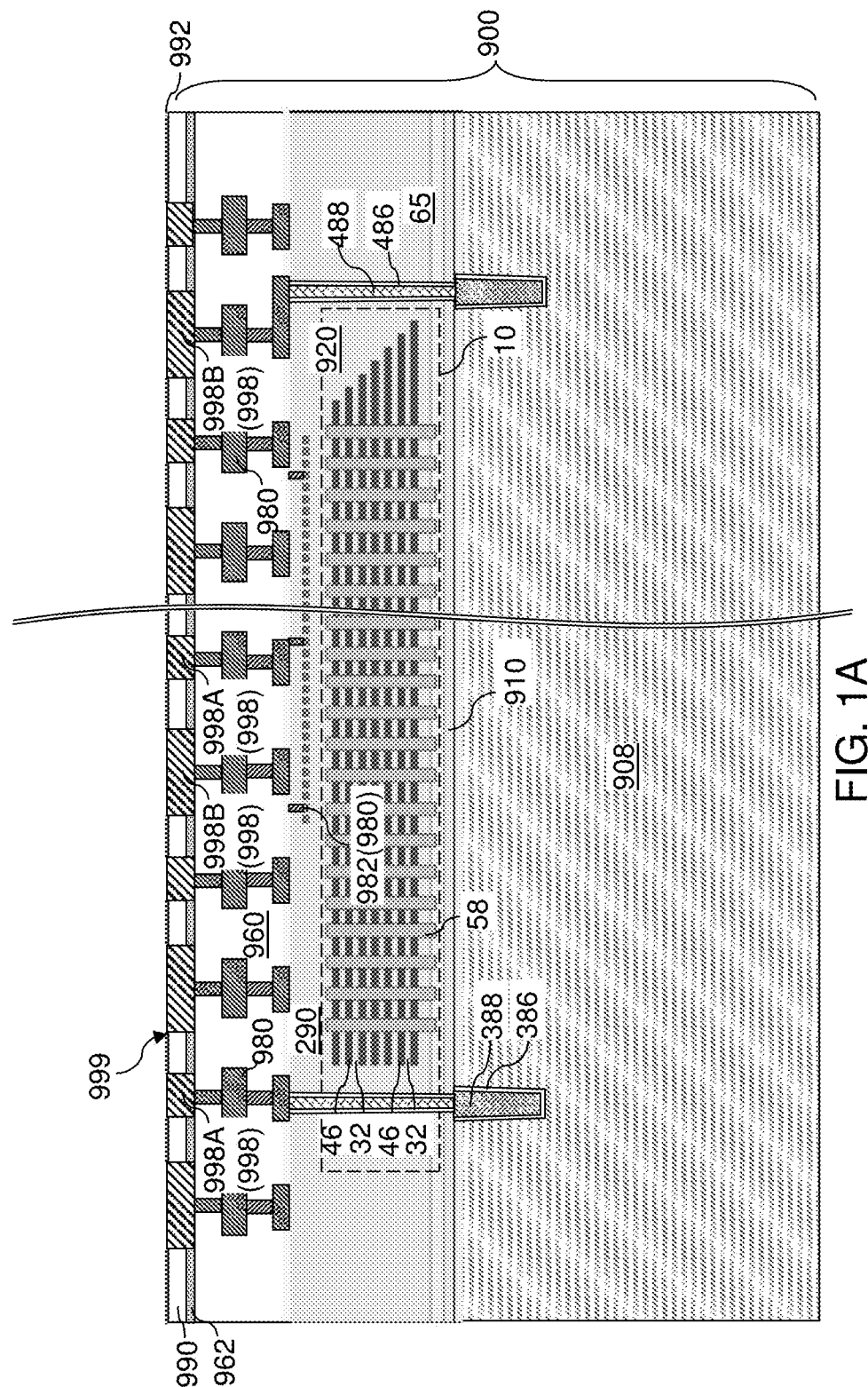

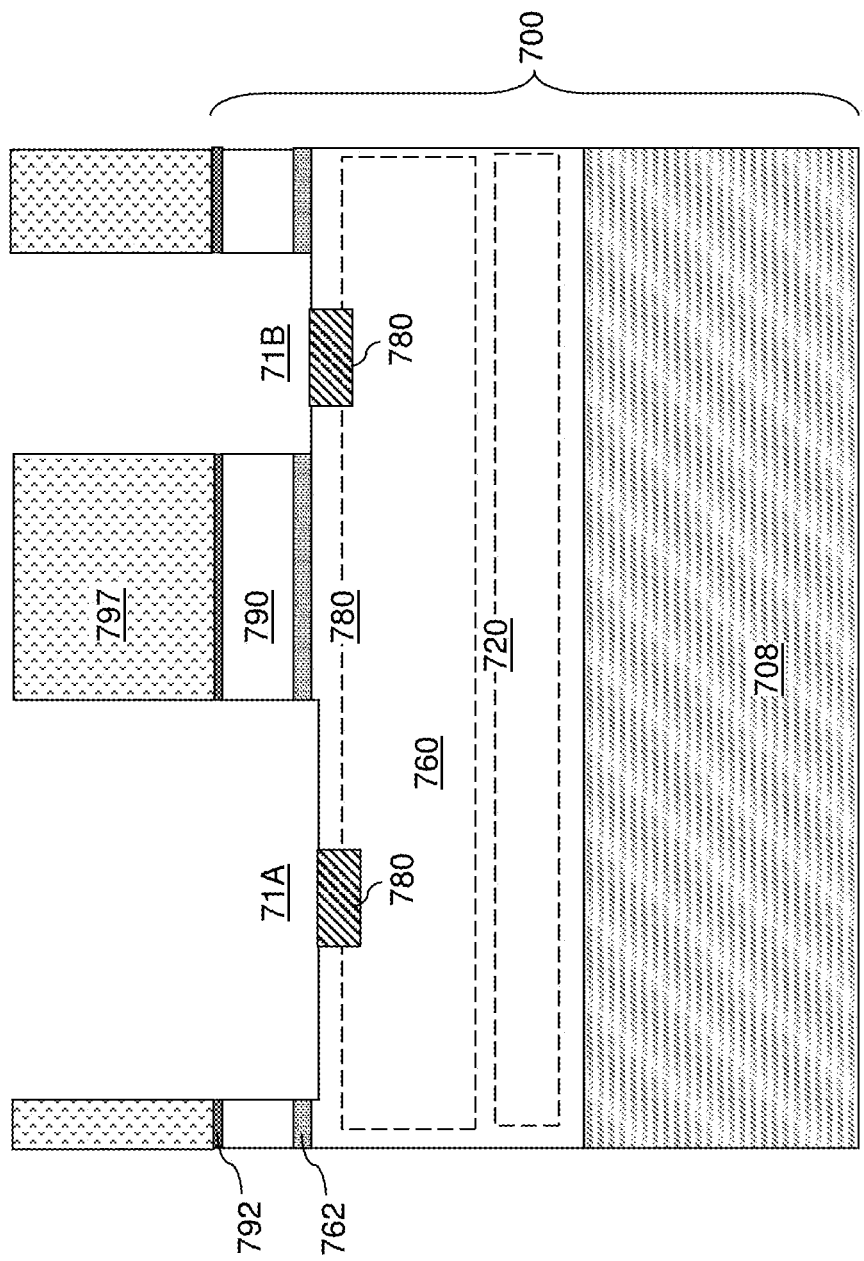

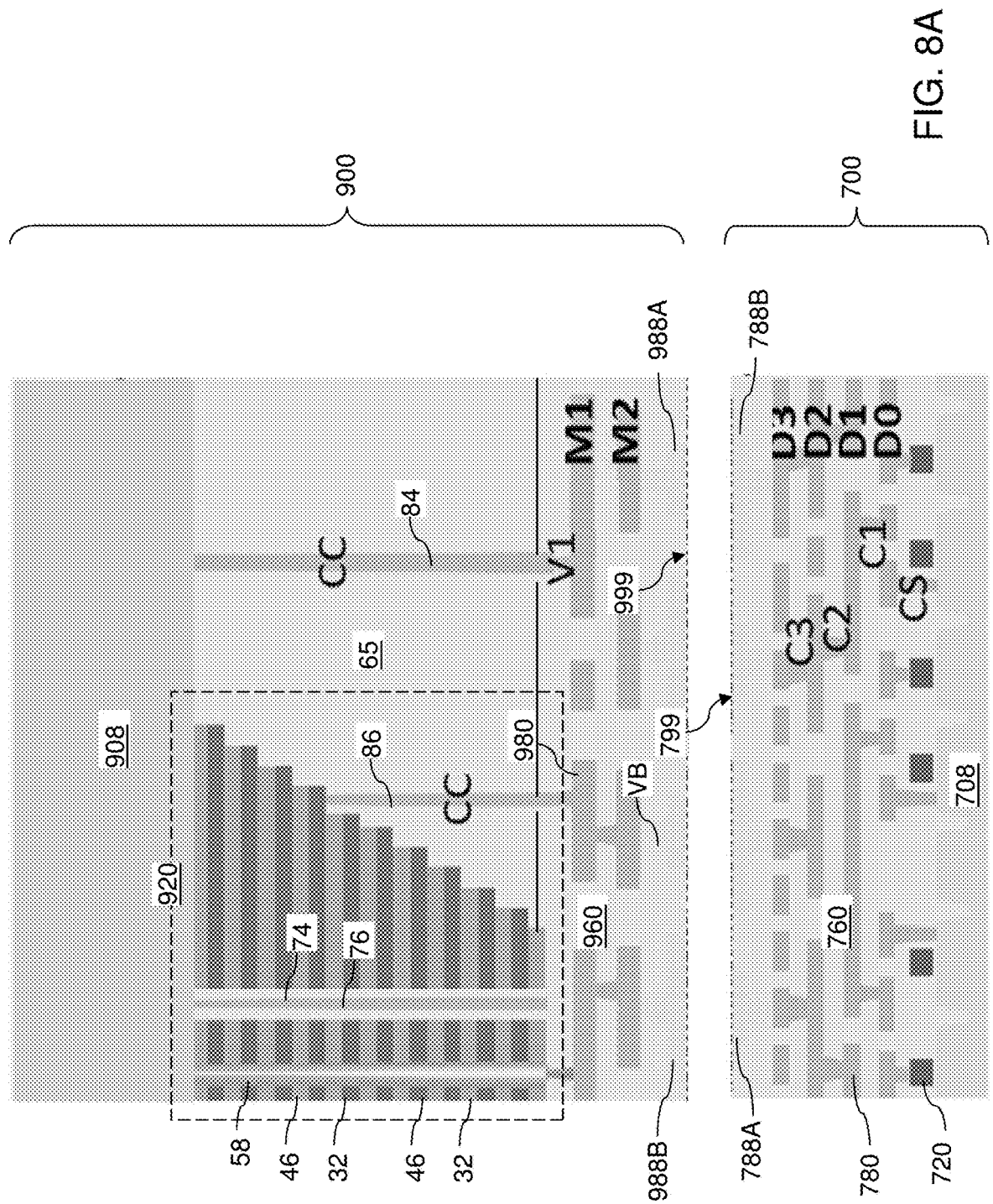

BONDED ASSEMBLY CONTAINING DIFFERENT SIZE OPPOSING BONDING PADS AND METHODS OF FORMING THE SAME

FIELD

The present disclosure relates generally to the field of semiconductor devices, and particularly to a bonded assembly containing different size opposing bonding pads and methods for forming the same.

BACKGROUND

A pair of semiconductor dies may be bonded to each other to form a semiconductor chip. Metal-to-metal bonding may be employed to provide signal paths between the pair of semiconductor dies.

SUMMARY

According to an aspect of the present disclosure, a bonded assembly includes a primary semiconductor die comprising first semiconductor devices and primary bonding pads, and a complementary semiconductor die comprising second semiconductor devices and complementary bonding pads. The primary bonding pads comprise first primary bonding pads and second primary bonding pads having a larger bonding area than the first primary bonding pads, and the complementary bonding pads comprise first complementary bonding pads and second complementary bonding pads having a smaller bonding area than the first complementary bonding pads. The first complementary bonding pads are bonded to a respective one of the first primary bonding pads, and the second complementary bonding pads are bonded to a respective one of the second primary bonding pads.

According to another aspect of the present disclosure, a bonded assembly of a primary semiconductor die and a complementary semiconductor die includes first pairs of first primary bonding pads and first complementary bonding pads that are larger in area than the first primary bonding pads, and second pairs of second primary bonding pads and second complementary bonding pads that are smaller in area than the second primary bonding pads.

According to another aspect of the present disclosure, a method of forming a bonded assembly comprises providing a primary semiconductor die, wherein the primary semiconductor die comprises first semiconductor devices and primary bonding pads, wherein the primary bonding pads comprise first primary bonding pads and second primary bonding pads having a larger bonding area than the first bonding pads; providing a complementary semiconductor die, wherein the complementary semiconductor die comprises second semiconductor devices and complementary bonding pads, wherein the complementary bonding pads comprise first complementary bonding pads and second complementary bonding pads having a smaller bonding area than the first complementary bonding pads; and bonding the complementary semiconductor die to the primary semiconductor die such that the first complementary bonding pads are bonded to a respective one of the first primary bonding pads and the second complementary bonding pads are bonded to a respective one of the second primary bonding pads.

BRIEF DESCRIPTION OF THE DRAWINGS

FIG. 1A is a schematic vertical cross-sectional view of a primary semiconductor die after formation of primary bonding pads according to an embodiment of the present disclosure.

FIGS. 4A-4C are sequential vertical cross-sectional views of a region of the complementary semiconductor die during formation of the complementary bonding pads according to an embodiment of the present disclosure.

FIGS. 8A-8C are sequential vertical cross-sectional views of a second exemplary structure during formation of a bonded assembly according to an embodiment of the present disclosure.

DETAILED DESCRIPTION

Figure 1B:
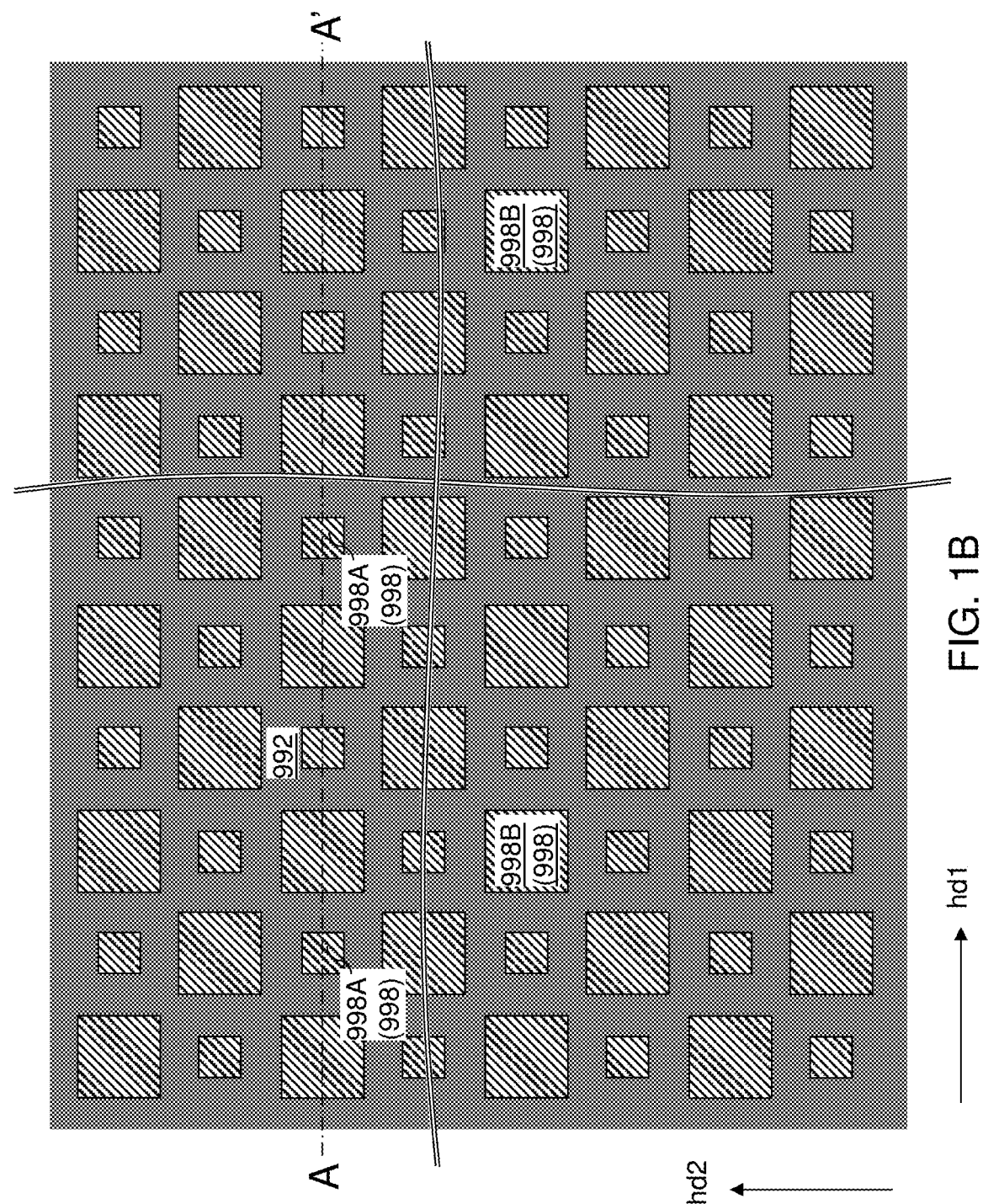
FIG. 1B is a top-down view of the primary semiconductor die of FIG. 1A. The vertical plane A-A' is the plane of vertical cross-sectional view of FIG. 1A.

Hybrid bonding can provide enhanced bonding strength between a pair of bonded semiconductor dies because dielectric-to-dielectric bonding is employed in conjunction with metal-to-metal bonding between mating pairs of bonding pads. Typically, the fraction of the bonding pad areas relative to the total bonding surface area is limited to less than 25% due to concern for CMP-induced post-bonding void formation. Further, a minimum pad-to-pad distance is desired to avoid CMP-related processing issues. Thus, scaling the pad size can result in significant decrease in the fraction of the bonding pad areas relative to the total bonding surface area.

As discussed above, embodiments of the present disclosure are directed to a bonded assembly containing different size opposing bonding pads and methods for forming the same, the various aspects of which are described now in detail. The different size bonding pads provide a reduction of the local bonding pad density, thus reducing CMP-induced post-bonding void formation.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to $1.0$ S/m in the absence of electrical dopants therein, and is capable of producing a doped material having electrical conductivity in a range from $1.0$ S/m to $1.0\times10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic percentage to become a conductive material either as formed as a crystalline material or if converted into a crystalline material through an anneal process (for example, from an initial amorphous state), i.e., to have electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic percentage of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A and 1B, a primary semiconductor die 900 is illustrated. As used herein, a primary semiconductor die refers to a first semiconductor die that is described, and does not connote any primacy in functionality relative to a second semiconductor die that is subsequently bonded to the first semiconductor die. The primary semiconductor die 900 includes a first substrate 908, first semiconductor devices 920 overlying the first substrate 908, first interconnect-level dielectric material layers (290, 960) located on the first semiconductor devices, and first metal interconnect structures 980 embedded in the first interconnect-level dielectric material layers (290, 960). In one embodiment, the first substrate 908 may be a first substrate such as a commercially available silicon wafer having a thickness in a range from 500 microns to 1 mm.

In one embodiment, discrete substrate recess cavities may be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A through-substrate liner 386 and a through-substrate via structure 388 can be formed within each discrete substrate recess cavity.

Generally, the first semiconductor devices 920 may comprise any semiconductor device known in the art. In one embodiment, the primary semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Stepped dielectric material portions 65 may be formed around each vertically alternating stack (32, 46) to provide electrical isolation between neighboring vertically alternating stacks (32, 46).

Through-memory-level via cavities can be formed through the stepped dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. As used herein, a "proximal" surface refers to a surface that is close to a substrate, and a "distal" surface refers to a surface that is distal from the substrate. In the primary semiconductor die 900, a proximal surface refers to a surface that is close to the first substrate 908, and a distal surface refers to a surface that is distal from the first substrate 908.

The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include multiple memory-side metal line levels and multiple memory-side metal via levels.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. The first distal interconnect-level dielectric material layers 960 may include one or more dielectric diffusion barrier layers (not expressly shown). In this case, each dielectric diffusion barrier layer embedded in the first distal interconnect-level dielectric material layers 960 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier layer embedded in the first distal interconnect-level dielectric material layers 960 may include a dielectric material having a dielectric constant less than 5, such as SiCN having a dielectric constant of about 3.8, to reduce RC delay of the first metal interconnect structures 980. Each dielectric diffusion barrier layer may have a thickness in a range from 10 nm to 30 nm.

A first pad-level layer stack (962, 990, 992) including an optional first diffusion barrier layer 962, a primary pad-level dielectric layer 990, and an optional primary planarization dielectric liner 992 can be formed. The first diffusion barrier layer 962, if present, can include a dielectric material that blocks copper diffusion. In one embodiment, the first diffusion barrier layer 962 can include silicon nitride, silicon carbon nitride, silicon oxynitride, or a stack thereof. The thickness of the first diffusion barrier layer 962 can be in a range from 5 nm to 50 nm, although lesser and greater thicknesses can also be employed.

The primary pad-level dielectric layer 990 may include, and/or consist essentially of, undoped silicate glass (e.g., silicon oxide), a doped silicate glass, organosilicate glass, silicon nitride, or a dielectric metal oxide. The thickness of the primary pad-level dielectric layer 990 may be in a range from 300 nm to 6,000 nm, although lesser and greater thicknesses may also be employed. The primary pad-level dielectric layer 990 may have a planar top surface. The primary pad-level dielectric layer 990 may also be referred to as a first pad-level dielectric layer.

The primary planarization dielectric liner 992, if present, may include a dielectric material that may function as a stopping layer for a planarization process that can be employed to form primary bonding pads 998 that are embedded within the first pad-level layer stack (962, 990, 992). For example, the primary planarization dielectric liner 992 may include silicon carbide nitride (SiCN) or silicon nitride, and may have a thickness in a range from 2 nm to 60 nm, such as from 4 nm to 30 nm, although lesser and greater thicknesses may also be employed. The primary planarization dielectric liner 992 is also referred to as a first planarization dielectric liner 992. The set of all dielectric material layers overlying the top surface of the alternating stack (32, 46) is herein referred to as first dielectric material layers (290, 960, 962, 990, 992).

Figure 2A:
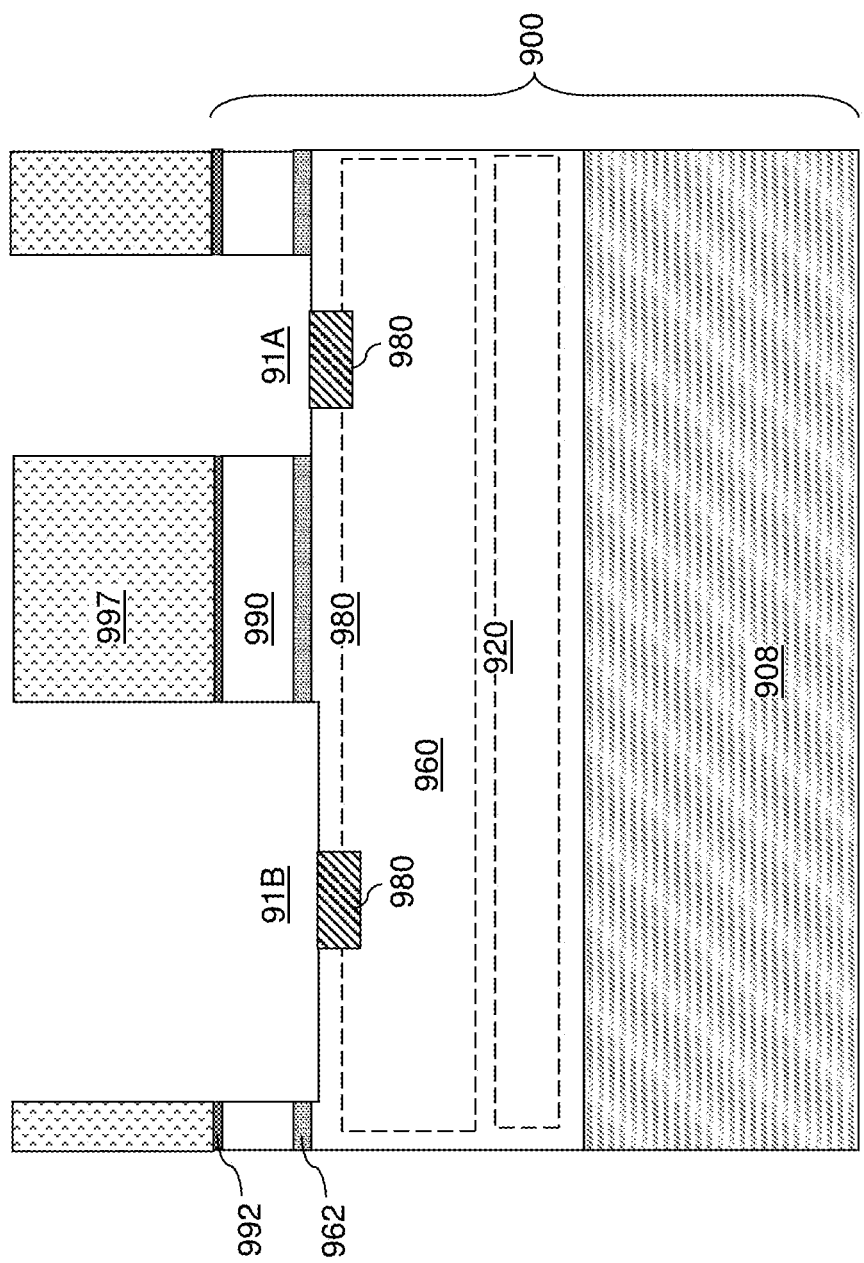
FIGS. 2A-2C are sequential vertical cross-sectional views of a region of the primary semiconductor die during formation of the primary bonding pads according to an embodiment of the present disclosure.
Figure 2B:
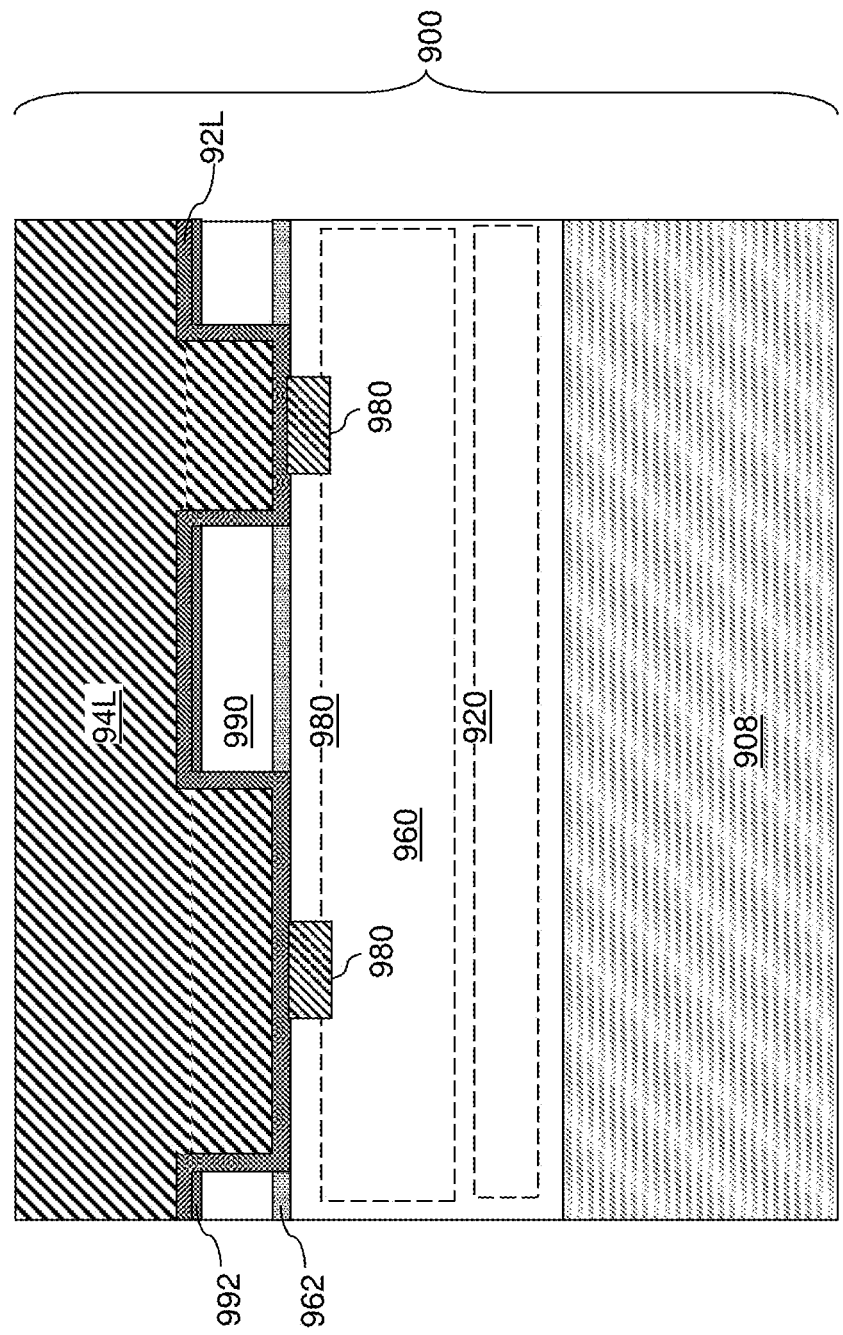
Figure 2C:
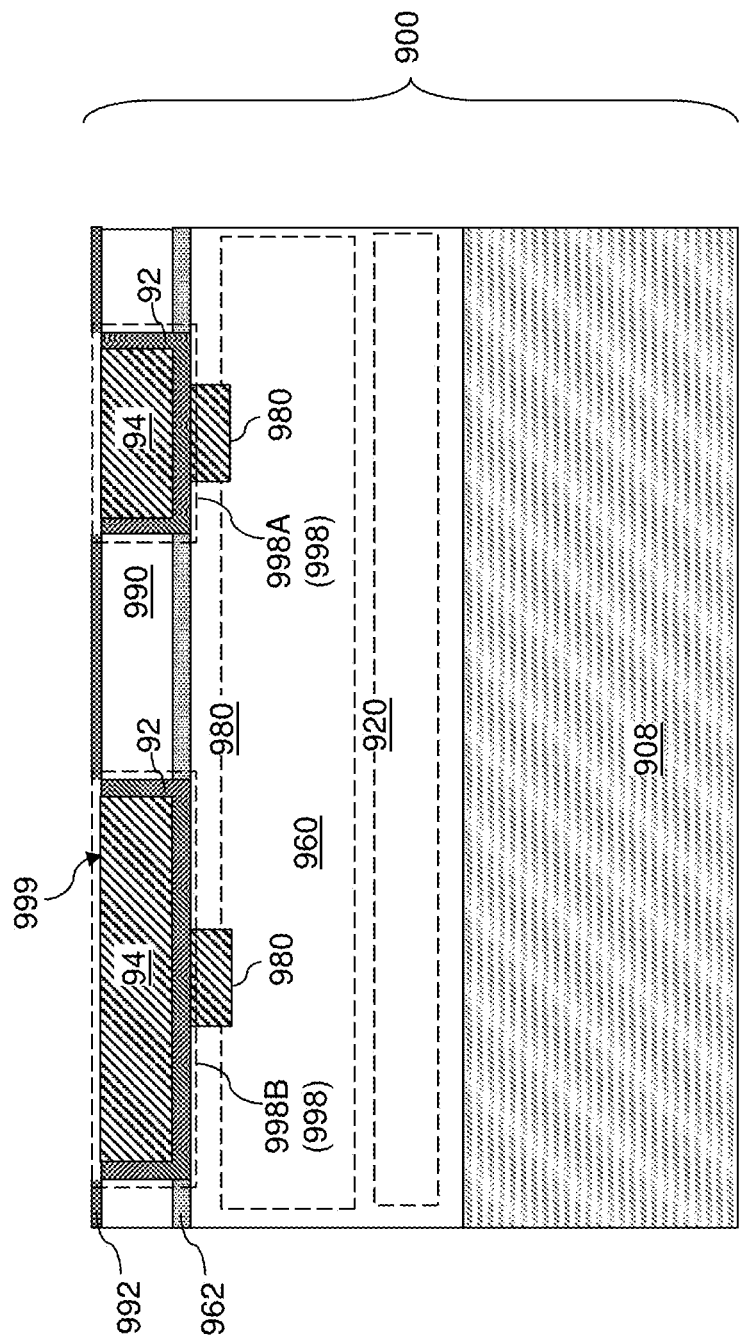

FIGS. 2A-2C are sequential vertical cross-sectional views of a region of the primary semiconductor die during formation of the primary bonding pads according to an embodiment of the present disclosure.

Referring to FIG. 2A, a photoresist layer 997 can be applied over the primary pad-level dielectric layer 990, and can be lithographically patterned to form discrete openings in areas that overlie topmost metal interconnect structures of the first metal interconnect structures 980. According to an aspect of the present disclosure, the discrete openings may comprise first openings of a first size and second openings of a second size. The first size may be smaller than the second size. The pattern of the discrete openings may be suitably selected to provide suitable patterns for the primary bonding pads 998 that are subsequently formed, as will be described below.

An anisotropic etch process can be performed to transfer the pattern of the openings in the photoresist layer 997 through the optional primary planarization dielectric liner 992, the primary pad-level dielectric layer 990, and the optional first diffusion barrier layer 962. Primary pad via cavities (91A, 91B) are formed through the optional primary planarization dielectric liner 992, the primary pad-level dielectric layer 990, and the optional first diffusion barrier layer 962 in areas that overlie metal interconnect structures 980. A top surface of a topmost metal interconnect structure 980 can be physically exposed at the bottom of each primary pad via cavity (91A, 91B). In one embodiment, each primary pad via cavity (91A, 91B) can be formed within the area of a respective one of the topmost metal interconnect structures.

The primary pad cavities (91A, 91B) comprise first primary pad cavities 91A and second primary pad cavities 91B. In one embodiment, the primary pad cavities (91A, 91B) are arranged in at least one row (which is herein referred to as at least one primary-side row) in which a respective subset of the first primary pad cavities 91A alternates with a respective subset of the second primary pad cavities 91B along a first horizontal direction hd1. In one embodiment, the primary pad cavities (91A, 91B) may be arranged in a plurality of primary-side rows in which a respective subset of the first primary pad cavities 91A alternates with a respective subset of the second primary pad cavities 91B along the first horizontal direction hd1. In other words, the at least one primary-side row comprises multiple primary-side rows that are laterally spaced apart along a second horizontal direction hd2, which is perpendicular to the first horizontal direction hd1.

In one embodiment, each of the first primary pad cavities 91A has a first area of the same size and the same shape, and each of the second primary pad cavities 91B has a second area of the same size and the same shape. According to an aspect of the present disclosure, the ratio of the second area to the first area is in a range from 1.2 to 4, such as from 1.5 to 3. Thus, the second area of the second primary pad cavities 91B is larger than the first area of the first primary pad cavities 91A.

In one embodiment, each of the multiple primary-side rows of a respective primary pad cavities (91A, 91B) may be periodic along the first horizontal direction hd1, and may have a first pitch along the first horizontal direction hd1. In one embodiment, the first primary pad cavities 91A and the second primary pad cavities 91B may alternate along the first horizontal direction hd1 within each primary-side row of primary pad cavities (91A, 91B).

In one embodiment, a pattern of each primary-side row among the multiple primary-side rows may be laterally offset along the first horizontal direction hd1 by one half of the first pitch relative to a respective most proximal primary-side row among the multiple primary-side rows. In this case, a two-dimensional periodic array of first primary pad cavities 91A and a two-dimensional periodic array of second primary pad cavities 91B can be interlaced with each other.

In one embodiment, the first primary pad cavities 91A may be arranged in a first two-dimensional periodic array having a first pitch along a first horizontal direction (such as the first horizontal direction hd1 shown in FIG. 1B) and having a second pitch along a second horizontal direction (such as the second horizontal direction hd2 shown in FIG. 1B). The second primary pad cavities 91B may be arranged in a second two-dimensional periodic array having the first pitch along the first horizontal direction and having the second pitch along the second horizontal direction. Each of the two-dimensional periodic array of first primary pad cavities 91A and the two-dimensional periodic array of second primary pad cavities 91B may have a same first pitch along the first horizontal direction hd1 and a same second pitch along the second horizontal direction hd2. In one embodiment, the two-dimensional periodic array of second primary pad cavities 91B may be laterally offset along the first horizontal direction hd1 from the two-dimensional periodic array of first primary pad cavities 91A by one half of the first pitch, and may be laterally offset along the second horizontal direction hd2 from the two-dimensional periodic array of first primary pad cavities 91A by one half of the second pitch. In this case, a geometrical center of each of the second primary pad cavities 91B may be laterally offset from a geometrical center of a respective most proximal one of the first primary pad cavities 91A by one half of the first pitch along the first horizontal direction and by one half of the second pitch along the second horizontal direction. The photoresist layer 997 can be subsequently removed, for example, by ashing.

Referring to FIG. 2B, an optional pad-level metallic barrier liner 92L and a pad-level metallic fill material layer 94L can be sequentially deposited in the primary pad cavities (91A, 91B). The pad-level metallic barrier liner 92L may comprise a metallic barrier material such as TiN, TaN, WN, MoN, TiC, TaC, and/or WC, and may have a thickness in a range from 1 nm to 50 nm, such as from 3 nm to 20 nm, although lesser and greater thicknesses may also be employed. The pad-level metallic fill material layer 94L may comprise a metallic material that can be subsequently bonded with another metallic material. In one embodiment, the pad-level metallic fill material layer 94L may comprise, and/or may consist essentially of, copper or a copper-containing alloy.

Referring to FIG. 2C, portions of the pad-level metallic barrier liner 92L and the pad-level metallic fill material layer 94L can be removed from above the horizontal plane including the top surface of the optional primary planarization dielectric liner 992, or from above the horizontal plane including the top surface of the primary pad-level dielectric layer 990 (in case a primary planarization dielectric liner is not present). Remaining portions of the pad-level metallic barrier liner 92L and the pad-level metallic fill material layer 94L comprise primary bonding pads 998. Specifically, remaining portions of the pad-level metallic barrier liner 92L and the pad-level metallic fill material layer 94L that remain in each first primary pad cavity 91A constitutes a first primary bonding pad 998A, and remaining portions of the pad-level metallic barrier liner 92L and the pad-level metallic fill material layer 94L that remain in each second primary pad cavity 91B constitutes a second primary bonding pad 998B. Each primary bonding pad 998 comprises a respective optional first metallic barrier liner 92 that is a patterned portion of the pad-level metallic barrier liner 92L, and a first metallic bonding material portion 94 that is a patterned portion of the pad-level metallic fill material layer 94L.

In summary, referring collectively to FIGS. 1A, 1B, and 2C, a primary semiconductor die 900 is provided. The primary semiconductor die 900 comprises first semiconductor devices 920 and primary bonding pads 998 located on first dielectric material layers (290, 960, 962, 990, 992) that embed first metal interconnect structures 980. The primary bonding pads 998 comprise first primary bonding pads 998A and second primary bonding pads 998B. The primary bonding pads 998 occupy less than 25% of the primary bonding surface 999 of the first semiconductor die 900. The first dielectric material layers (290, 960, 962, 990, 992) occupy at least 75% of the remaining primary bonding surface 999 of the first semiconductor die 900.

As shown in FIG. 1B, the primary bonding pads 998 comprise first primary bonding pads 998A and second primary bonding pads 998B. In one embodiment, the primary bonding pads 998 are arranged in at least one row (which is herein referred to as at least one primary-side row) in which a respective subset of the first primary bonding pads 998A alternates with a respective subset of the second primary bonding pads 998B along a first horizontal direction hd1. In one embodiment, the primary bonding pads 998 may be arranged in a plurality of primary-side rows in which a respective subset of the first primary bonding pads 998A alternates with a respective subset of the second primary bonding pads 998B along the first horizontal direction hd1. In other words, the at least one primary-side row comprises multiple primary-side rows that are laterally spaced apart along a second horizontal direction hd2, which is perpendicular to the first horizontal direction hd1.

In one embodiment, each of the first primary bonding pads 998A has a first area of the same size and the same shape, and each of the second primary bonding pads 998B has a second area of the same size and the same shape. According to an aspect of the present disclosure, the ratio of the second area to the first area is in a range from 1.2 to 4, such as from 1.5 to 3. Thus, the second area of the second primary bonding pads 998B is larger than the first area of the first primary bonding pads 998A.

In one embodiment, each of the multiple primary-side rows of a respective primary bonding pads 998 may be periodic along the first horizontal direction hd1, and may have a first pitch along the first horizontal direction hd1. In one embodiment, the first primary bonding pads 998A and the second primary bonding pads 998B may alternate along the first horizontal direction hd1 within each primary-side row of primary bonding pads 998.

In one embodiment, a pattern of each primary-side row among the multiple primary-side rows may be laterally offset along the first horizontal direction hd1 by one half of the first pitch relative to a respective most proximal primary-side row among the multiple primary-side rows. In this case, a two-dimensional periodic array of first primary bonding pads 998A and a two-dimensional periodic array of second primary bonding pads 998B can be interlaced with each other.

In one embodiment, the first primary bonding pads 998A may be arranged in a first two-dimensional periodic array having a first pitch along the first horizontal direction hd1 and having a second pitch along the second horizontal direction hd2. The second primary bonding pads 998B may be arranged in a second two-dimensional periodic array having the first pitch along the first horizontal direction hd1 and having the second pitch along the second horizontal direction hd2. Each of the two-dimensional periodic array of first primary bonding pads 998A and the two-dimensional periodic array of second primary bonding pads 998B may have a same first pitch along the first horizontal direction hd1 and a same second pitch along the second horizontal direction hd2. In one embodiment, the two-dimensional periodic array of second primary bonding pads 998B may be laterally offset along the first horizontal direction hd1 from the two-dimensional periodic array of first primary bonding pads 998A by one half of the first pitch, and may be laterally offset along the second horizontal direction hd2 from the two-dimensional periodic array of first primary bonding pads 998A by one half of the second pitch. In this case, a geometrical center of each of the second primary bonding pads 998B may be laterally offset from a geometrical center of a respective most proximal one of the first primary bonding pads 998A by one half of the first pitch along the first horizontal direction hd1 and by one half of the second pitch along the second horizontal direction hd2.

In one embodiment, the primary semiconductor die 900 comprises a memory die including a three-dimensional array of memory elements. In one embodiment, the first dielectric material layers (290, 960, 962, 990, 992) comprise first interconnect-level dielectric material layers (290, 960) embedding the first metal interconnect structures 980, a first diffusion barrier layer 962 located on the first interconnect-level dielectric material layers (290, 960), and a primary pad-level dielectric layer 990 located on the first diffusion barrier layer 962 and embedding the primary bonding pads 988.

Figure 3A:
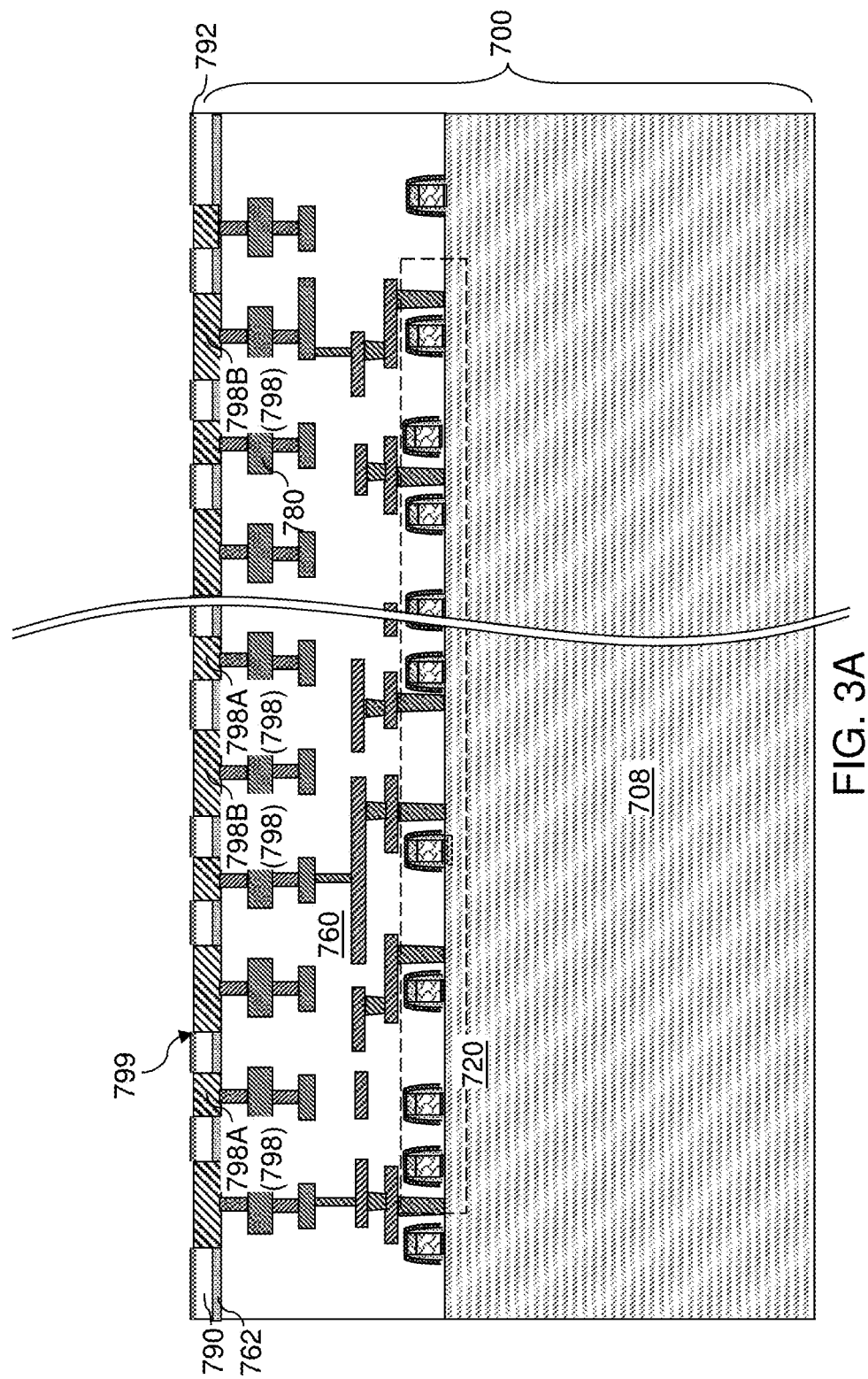
FIG. 3A is a schematic vertical cross-sectional view of a complementary semiconductor die after formation of complementary bonding pads according to an embodiment of the present disclosure.
Figure 3B:
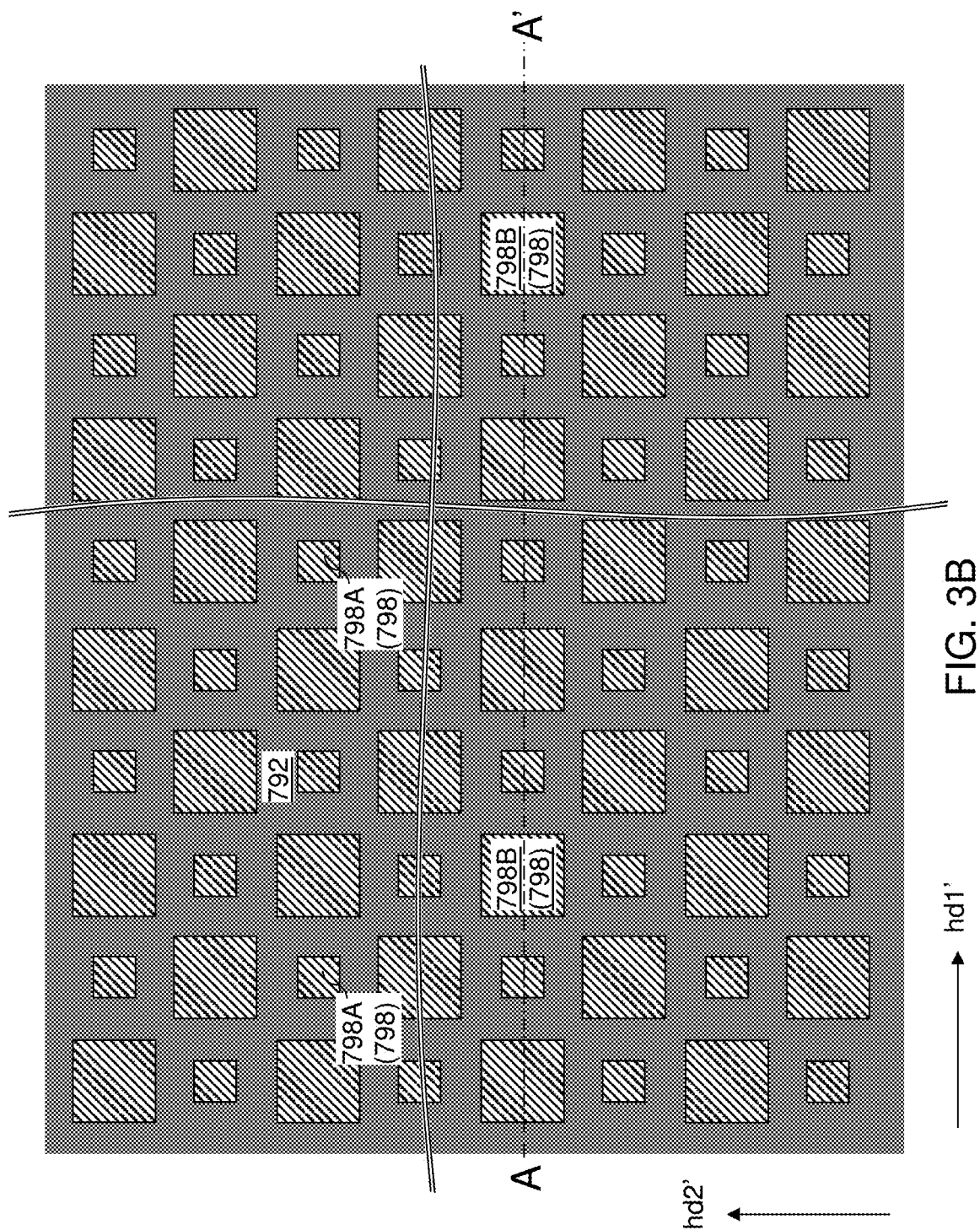
FIG. 3B is a top-down view of the complementary semiconductor die of FIG. 3A. The vertical plane A-A' is the plane of vertical cross-sectional view of FIG. 3A.

Referring to FIGS. 3A and 3B, a complementary semiconductor die 700 according to an embodiment of the present disclosure is illustrated. As used herein, a complementary semiconductor die refers to any semiconductor die that can be employed with another semiconductor die such as a primary semiconductor die, and does not connote any complementary nature in its functionality relative to the primary semiconductor die. Thus, a combination of a primary semiconductor die and a complementary semiconductor die may be employed to enhance functionality of the primary semiconductor die through the complementary semiconductor die, or to enhance functionality of the complementary semiconductor die through the primary semiconductor die, or to enhance functionality of both the primary semiconductor die and the complementary semiconductor die through interconnection with each other.

The complementary semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) peripheral circuitry in which field effect transistors area arranged in a CMOS configuration. In one embodiment, the second substrate 708 may be a second substrate such as a commercially available silicon substrate having a thickness in a range from 500 microns to 1 mm.

Generally, the second semiconductor devices 720 may comprise any semiconductor device that may be operated in conjunction with the first semiconductor devices 920 in the first semiconductor die 900 to provide enhanced functionality. In one embodiment, the first semiconductor die 900 comprises a memory die and the complementary semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the complementary semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second interconnect-level dielectric material layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include multiple logic-side metal line levels and multiple logic-side metal line levels.

A second pad-level layer stack (762, 790, 792) including an optional second diffusion barrier layer 762, a complementary pad-level dielectric layer 790, and an optional complementary planarization dielectric liner 792 can be formed. The second diffusion barrier layer 762, if present, can include a dielectric material that blocks copper diffusion. In one embodiment, the second diffusion barrier layer 762 can include silicon nitride, silicon carbon nitride, silicon oxynitride, or a stack thereof. The thickness of the second diffusion barrier layer 762 can be in a range from 5 nm to 50 nm, although lesser and greater thicknesses can also be employed.

The complementary pad-level dielectric layer 790 may include, and/or consist essentially of, undoped silicate glass (e.g., silicon oxide), a doped silicate glass, organosilicate glass, silicon nitride, or a dielectric metal oxide. The thickness of the complementary pad-level dielectric layer 790 may be in a range from 300 nm to 6,000 nm, although lesser and greater thicknesses may also be employed. The complementary pad-level dielectric layer 790 may have a planar top surface. The complementary pad-level dielectric layer 790 may also be referred to as a second pad-level dielectric layer.

The complementary planarization dielectric liner 792, if present, may include a dielectric material that may function as a stopping layer for a planarization process that can be employed to form complementary bonding pads 798 that are embedded within the second pad-level layer stack (762, 790, 792). For example, the complementary planarization dielectric liner 792 may include silicon carbide nitride (SiCN) or silicon nitride, and may have a thickness in a range from 2 nm to 60 nm, such as from 4 nm to 30 nm, although lesser and greater thicknesses may also be employed. The complementary planarization dielectric liner 792 is also referred to as a second planarization dielectric liner 792. The set of all dielectric material layers overlying the top surface of the alternating stack (32, 46) is herein referred to as second dielectric material layers (760, 762, 790, 792).

Figure 4B:
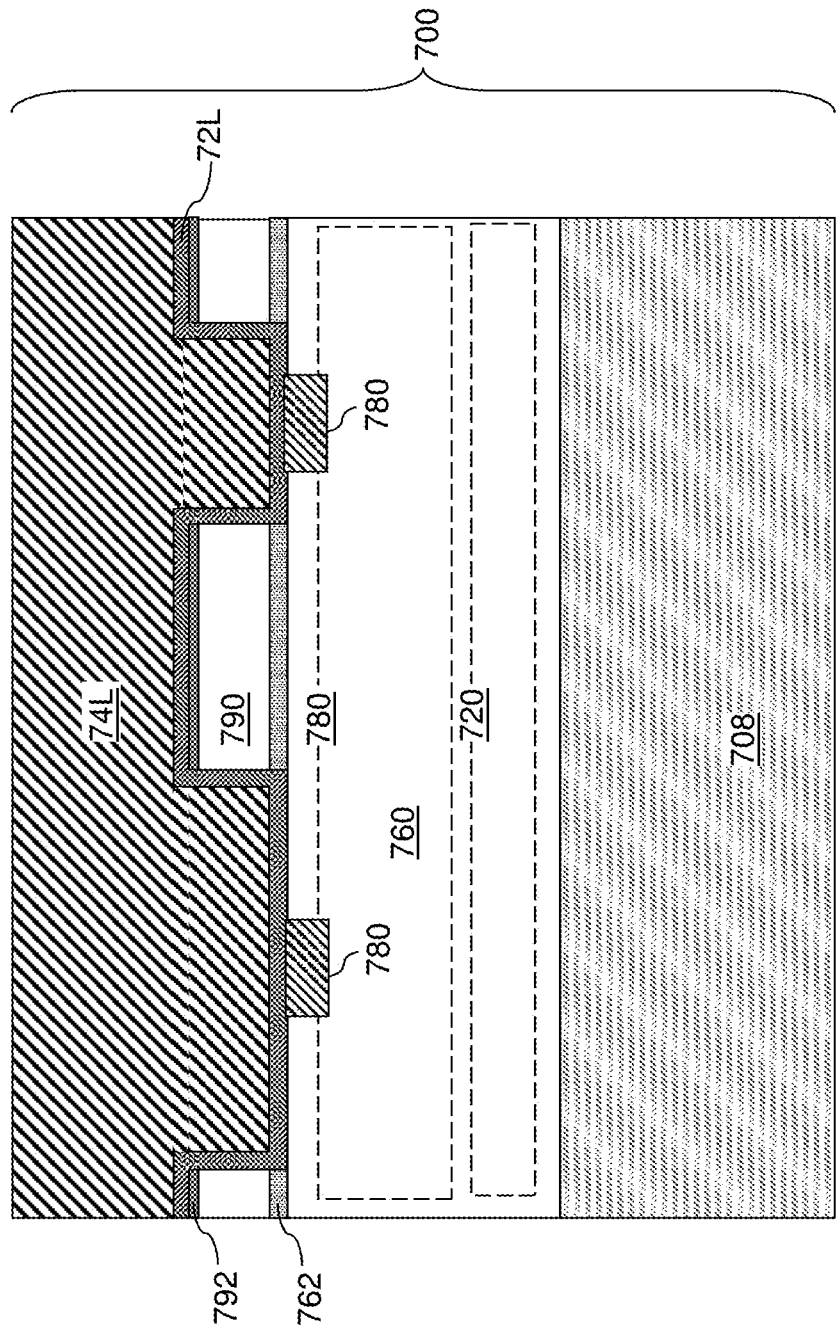
Figure 4C:
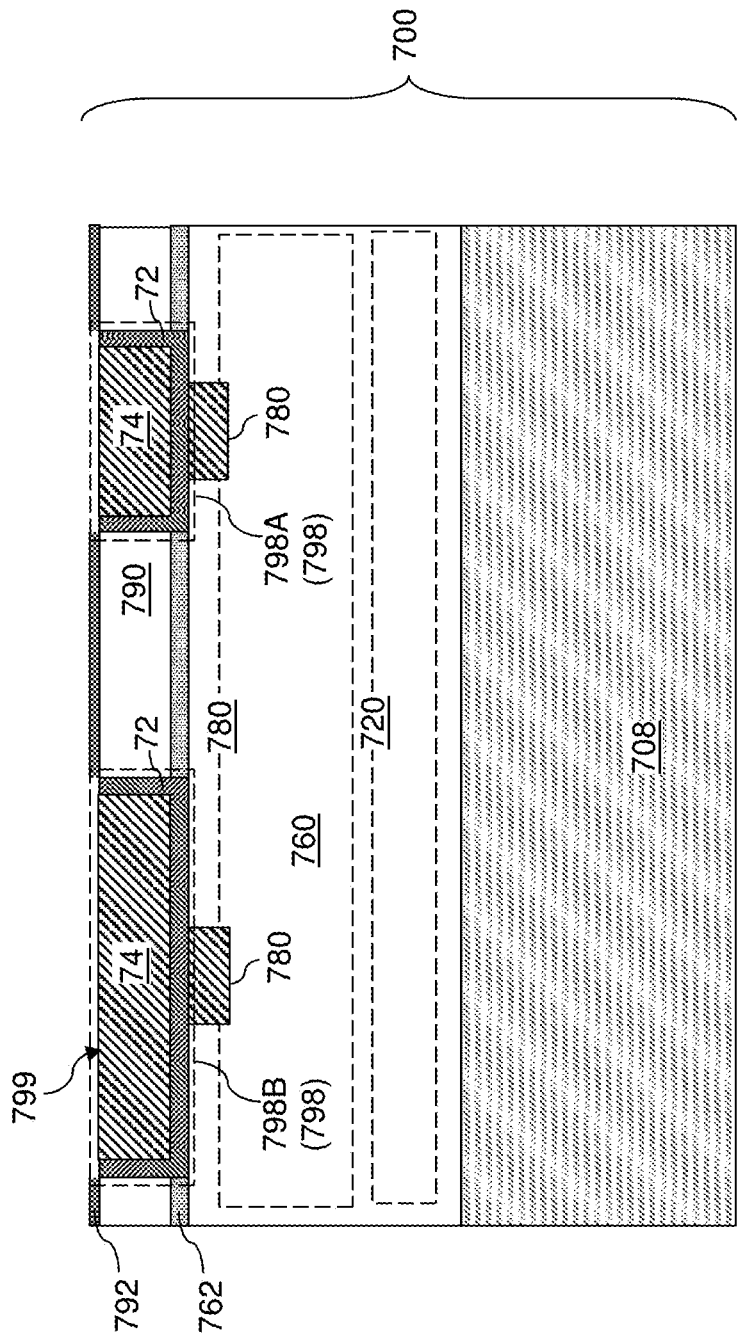

FIGS. 4A-4C are sequential vertical cross-sectional views of a region of the complementary semiconductor die during formation of the complementary bonding pads according to an embodiment of the present disclosure.

Referring to FIG. 4A, a photoresist layer 797 can be applied over the complementary pad-level dielectric layer 790, and can be lithographically patterned to form discrete openings in areas that overlie topmost metal interconnect structures of the second metal interconnect structures 780. According to an aspect of the present disclosure, the discrete openings may comprise third openings of a third size and fourth openings of a fourth size. The fourth size may be smaller than the third size. The pattern of the discrete openings may be suitably selected to provide suitable patterns for the complementary bonding pads 798 that are subsequently described in detail.

An anisotropic etch process can be performed to transfer the pattern of the openings in the photoresist layer 797 through the optional complementary planarization dielectric liner 792, the complementary pad-level dielectric layer 790, and the optional second diffusion barrier layer 762. Complementary pad via cavities (71A, 71B) are formed through the optional complementary planarization dielectric liner 792, the complementary pad-level dielectric layer 790, and the optional second diffusion barrier layer 762 in areas that overlie metal interconnect structures 780. A top surface of a topmost metal interconnect structure 780 can be physically exposed at the bottom of each complementary pad via cavity (71A, 71B). In one embodiment, each complementary pad via cavity (71A, 71B) can be formed within the area of a respective one of the topmost metal interconnect structures.

The complementary pad cavities (71A, 71B) comprise first complementary pad cavities 71A and second complementary pad cavities 71B. In one embodiment, the complementary pad cavities (71A, 71B) are arranged in at least one row (which is herein referred to as at least one complementary-side row) in which a respective subset of the first complementary pad cavities 71A alternates with a respective subset of the second complementary pad cavities 71B along a first horizontal direction hd1'. In one embodiment, the complementary pad cavities (71A, 71B) may be arranged in a plurality of complementary-side rows in which a respective subset of the first complementary pad cavities 71A alternates with a respective subset of the second complementary pad cavities 71B along the first horizontal direction hd1'. In other words, the at least one complementary-side row comprises multiple complementary-side rows that are laterally spaced apart along a second horizontal direction hd2', which is perpendicular to the first horizontal direction hd1'.

In one embodiment, each of the first complementary pad cavities 71A has a third area of the same size and the same shape, and each of the second complementary pad cavities 71B has a fourth area of the same size and the same shape. According to an aspect of the present disclosure, the ratio of the third area to the fourth area is in a range from 1.2 to 4, such as from 1.5 to 3. Thus, the third area is larger than the fourth area.

According to an aspect of the present disclosure, the third area can be larger than the first area, and the second area can be larger than the fourth area to enable metal-to-metal bonding between opposing metal bonding pads of different sizes. In one embodiment, the ratio of the third area to the first area may be in a range from 1.2 to 4, and the ratio of the second area to the fourth area may be in a range from 1.2 to 4. The fourth area and the first area may be the same, or may be different from each other. In one embodiment, the ratio of the first area to the fourth area is in a range from 0.5 to 2. The second area and the third area may be the same, or may be different from each other. The ratio of the third area to the second area may be in a range from 0.5 to 2.

In one embodiment, each of the multiple complementary-side rows of a respective complementary pad cavities (71A, 71B) may be periodic along the first horizontal direction hd1', and may have the first pitch along the first horizontal direction hd1'. In one embodiment, the second complementary pad cavities 71A and the second complementary pad cavities 71B may alternate along the first horizontal direction hd1' within each complementary-side row of complementary pad cavities (71A, 71B).

In one embodiment, a pattern of each complementary-side row among the multiple complementary-side rows may be laterally offset along the first horizontal direction hd1' by one half of the first pitch relative to a respective most proximal complementary-side row among the multiple complementary-side rows. In this case, a two-dimensional periodic array of second complementary pad cavities 71A and a two-dimensional periodic array of second complementary pad cavities 71B can be interlaced with each other.

In one embodiment, the second complementary pad cavities 71A may be arranged in a third two-dimensional periodic array having the first pitch along the first horizontal direction hd1' (shown in FIG. 4B) and having the second pitch along the second horizontal direction hd2' (shown in FIG. 1B). The second complementary pad cavities 71B may be arranged in a fourth two-dimensional periodic array having the first pitch along the first horizontal direction and having the second pitch along the second horizontal direction. Each of the two-dimensional periodic array of first complementary pad cavities 71A and the two-dimensional periodic array of second complementary pad cavities 71B may have the same first pitch along the first horizontal direction hd1' and the same second pitch along the second horizontal direction hd2'. In one embodiment, the two-dimensional periodic array of second complementary pad cavities 71B may be laterally offset along the first horizontal direction hd1' from the two-dimensional periodic array of first complementary pad cavities 71A by one half of the first pitch, and may be laterally offset along the second horizontal direction hd2' from the two-dimensional periodic array of first complementary pad cavities 71A by one half of the second pitch. In this case, a geometrical center of each of the second complementary pad cavities 71B may be laterally offset from a geometrical center of a respective most proximal one of the first complementary pad cavities 71A by one half of the first pitch along the first horizontal direction and by one half of the second pitch along the second horizontal direction. The photoresist layer 797 can be subsequently removed, for example, by ashing.

Referring to FIG. 4B, a pad-level metallic barrier liner 72L and a pad-level metallic fill material layer 74L can be sequentially deposited in the complementary pad cavities (71A, 71B). The pad-level metallic barrier liner 72L may comprise a metallic barrier material such as TiN, TaN, WN, MoN, TiC, TaC, and/or WC, and may have a thickness in a range from 1 nm to 50 nm, such as from 3 nm to 20 nm, although lesser and greater thicknesses may also be employed. The pad-level metallic fill material layer 74L may comprise a metallic material that can be subsequently bonded with another metallic material. In one embodiment, the pad-level metallic fill material layer 74L may comprise, and/or may consist essentially of, copper or a copper-containing alloy.

Referring to FIG. 4C, portions of the pad-level metallic barrier liner 72L and the pad-level metallic fill material layer 74L can be removed from above the horizontal plane including the top surface of the optional complementary planarization dielectric liner 792, or from above the horizontal plane including the top surface of the complementary pad-level dielectric layer 790 (in case a complementary planarization dielectric liner is not present). Remaining portions of the pad-level metallic barrier liner 72L and the pad-level metallic fill material layer 74L comprise complementary bonding pads 798. Specifically, remaining portions of the pad-level metallic barrier liner 72L and the pad-level metallic fill material layer 74L that remain in each first complementary pad cavity 71A constitutes a first complementary bonding pad 798A, and remaining portions of the pad-level metallic barrier liner 72L and the pad-level metallic fill material layer 74L that remain in each second complementary pad cavity 71B constitutes a second complementary bonding pad 798B. Each complementary bonding pad 798 comprises a respective second metallic barrier liner 72 that is a patterned portion of the pad-level metallic barrier liner 72L, and a second metallic bonding material portion 74 that is a patterned portion of the pad-level metallic fill material layer 74L.

In summary, referring to FIGS. 4A, 4B, and 4C, a complementary semiconductor die 700 is provided. The complementary semiconductor die 700 comprises second semiconductor devices 720 and complementary bonding pads 798 located on second dielectric material layers (760, 762, 790, 792) that embed second metal interconnect structures 780. The complementary bonding pads 798 comprise second complementary bonding pads 798A and second complementary bonding pads 798B. The complementary bonding pads 798 occupy less than 25% of the complementary bonding surface 799. The second dielectric material layers (760, 762, 790, 792) occupy at least 75% of the remaining complementary bonding surface 799.

The complementary bonding pads 798 comprise first complementary bonding pads 798A and second complementary bonding pads 798B. In one embodiment, the complementary bonding pads 798 are arranged in at least one row (which is herein referred to as at least one complementary-side row) in which a respective subset of the first complementary bonding pads 798A alternates with a respective subset of the second complementary bonding pads 798B along a first horizontal direction hd1'. In one embodiment, the complementary bonding pads 798 may be arranged in a plurality of complementary-side rows in which a respective subset of the first complementary bonding pads 798A alternates with a respective subset of the second complementary bonding pads 798B along the first horizontal direction hd1'. In other words, the at least one complementary-side row comprises multiple complementary-side rows that are laterally spaced apart along a second horizontal direction hd2', which is perpendicular to the first horizontal direction hd1'.

In one embodiment, each of the first complementary bonding pads 798A has a third area of the same size and the same shape, and each of the second complementary bonding pads 798B has a fourth area of the same size and the same shape. According to an aspect of the present disclosure, the ratio of the third area to the fourth area is in a range from 1.2 to 4, such as from 1.5 to 3. Thus, the third area is larger than the fourth area.

As discussed above, the third area can be larger than the first area, and the second area can be larger than the fourth area to enable metal-to-metal bonding between metal bonding pads of asymmetric sizes. In one embodiment, the ratio of the third area to the first area may be in a range from 1.2 to 4, and the ratio of the second area to the fourth area may be in a range from 1.2 to 4. The fourth area and the first area may be the same, or may be different from each other. In one embodiment, the ratio of the first area to the fourth area is in a range from 0.5 to 2. The second area and the third area may be the same, or may be different from each other. The ratio of the third area to the second area may be in a range from 0.5 to 2.

In one embodiment, each of the multiple complementary-side rows of a respective complementary bonding pads 798 may be periodic along the first horizontal direction hd1', and may have the first pitch along the first horizontal direction hd1'. In one embodiment, the second complementary bonding pads 798A and the second complementary bonding pads 798B may alternate along the first horizontal direction hd1' within each complementary-side row of complementary bonding pads 798.

In one embodiment, a pattern of each complementary-side row among the multiple complementary-side rows may be laterally offset along the first horizontal direction hd1' by one half of the first pitch relative to a respective most proximal complementary-side row among the multiple complementary-side rows. In this case, a two-dimensional periodic array of second complementary bonding pads 798A and a two-dimensional periodic array of second complementary bonding pads 798B can be interlaced with each other.

In one embodiment, the first complementary bonding pads 798A may be arranged in a third two-dimensional periodic array having the first pitch along the first horizontal direction hd1' and having the second pitch along the second horizontal direction hd2'. The second complementary bonding pads 798B may be arranged in a fourth two-dimensional periodic array having the first pitch along the first horizontal direction hd1' and having the second pitch along the second horizontal direction hd2'. Each of the two-dimensional periodic array of first complementary bonding pads 798A and the two-dimensional periodic array of second complementary bonding pads 798B may have the same first pitch along the first horizontal direction hd1' and the same second pitch along the second horizontal direction hd2'. In one embodiment, the two-dimensional periodic array of second complementary bonding pads 798B may be laterally offset along the first horizontal direction hd1' from the two-dimensional periodic array of first complementary bonding pads 798A by one half of the first pitch, and may be laterally offset along the second horizontal direction hd2' from the two-dimensional periodic array of first complementary bonding pads 798A by one half of the second pitch. In this case, a geometrical center of each of the second complementary bonding pads 798B may be laterally offset from a geometrical center of a respective most proximal one of the first complementary bonding pads 798A by one half of the first pitch along the first horizontal direction hd1' and by one half of the second pitch along the second horizontal direction hd2'.

In one embodiment, the complementary semiconductor die 700 comprises a logic die include a peripheral circuitry configured to operate the three-dimensional array of memory elements within the primary semiconductor die 900. In one embodiment, the second dielectric material layers (760, 762, 790, 792) comprise second interconnect-level dielectric material layers 760 embedding the second metal interconnect structures 780, a second diffusion barrier layer 762 located on the second interconnect-level dielectric material layers 760, and a complementary pad-level dielectric layer 790 located on the second diffusion barrier layer 762 and embedding the complementary bonding pads 788.

Figure 5A:
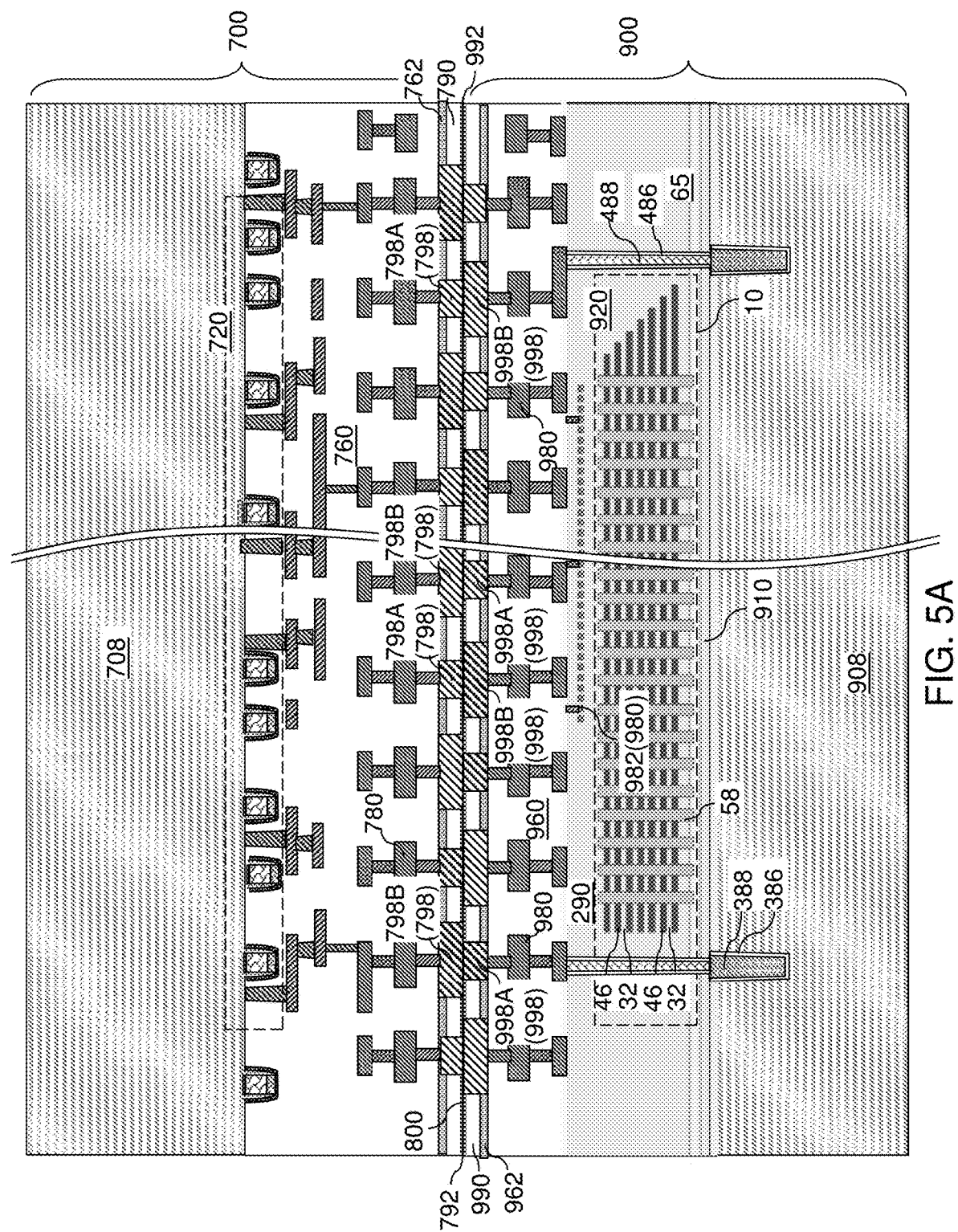
FIG. 5A is a schematic vertical cross-sectional view of an exemplary structure including a bonded assembly of the primary semiconductor die and the complementary semiconductor die according to an embodiment of the present disclosure.
Figure 5B:
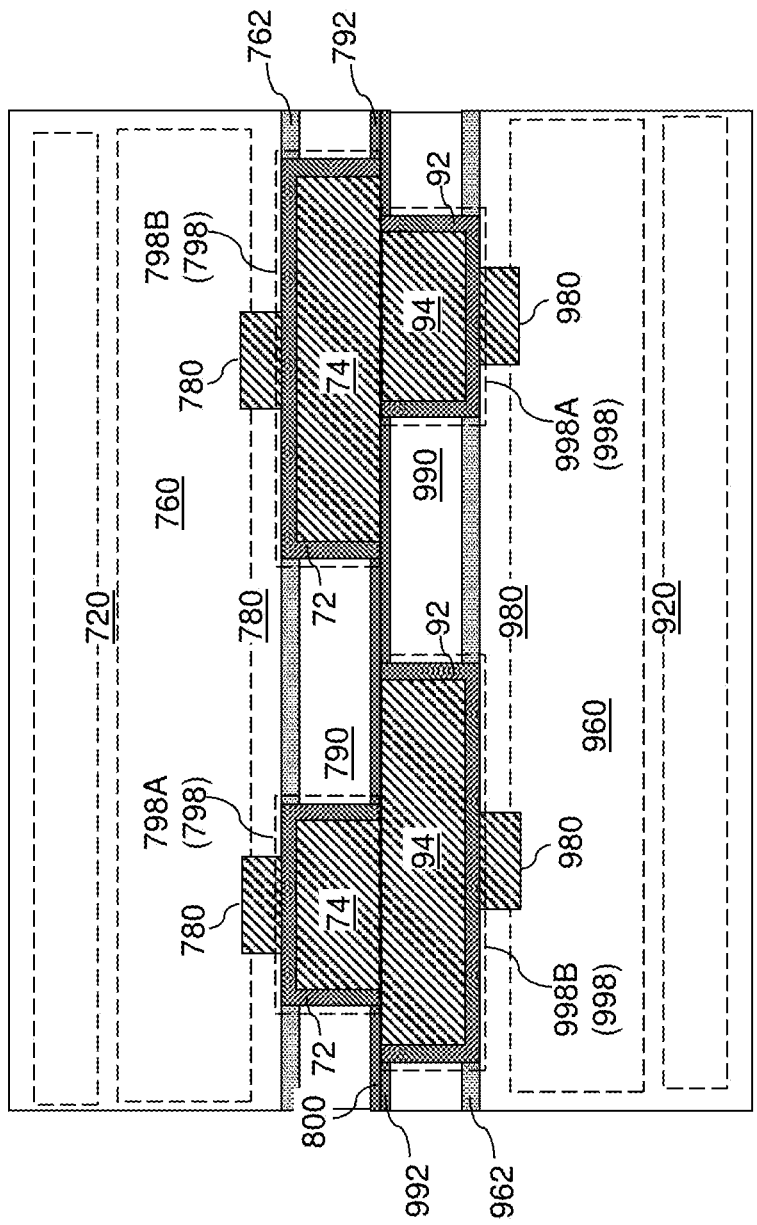
FIG. 5B is a magnified view of a region of the exemplary structure of FIG. 5A.
Figure 5C:
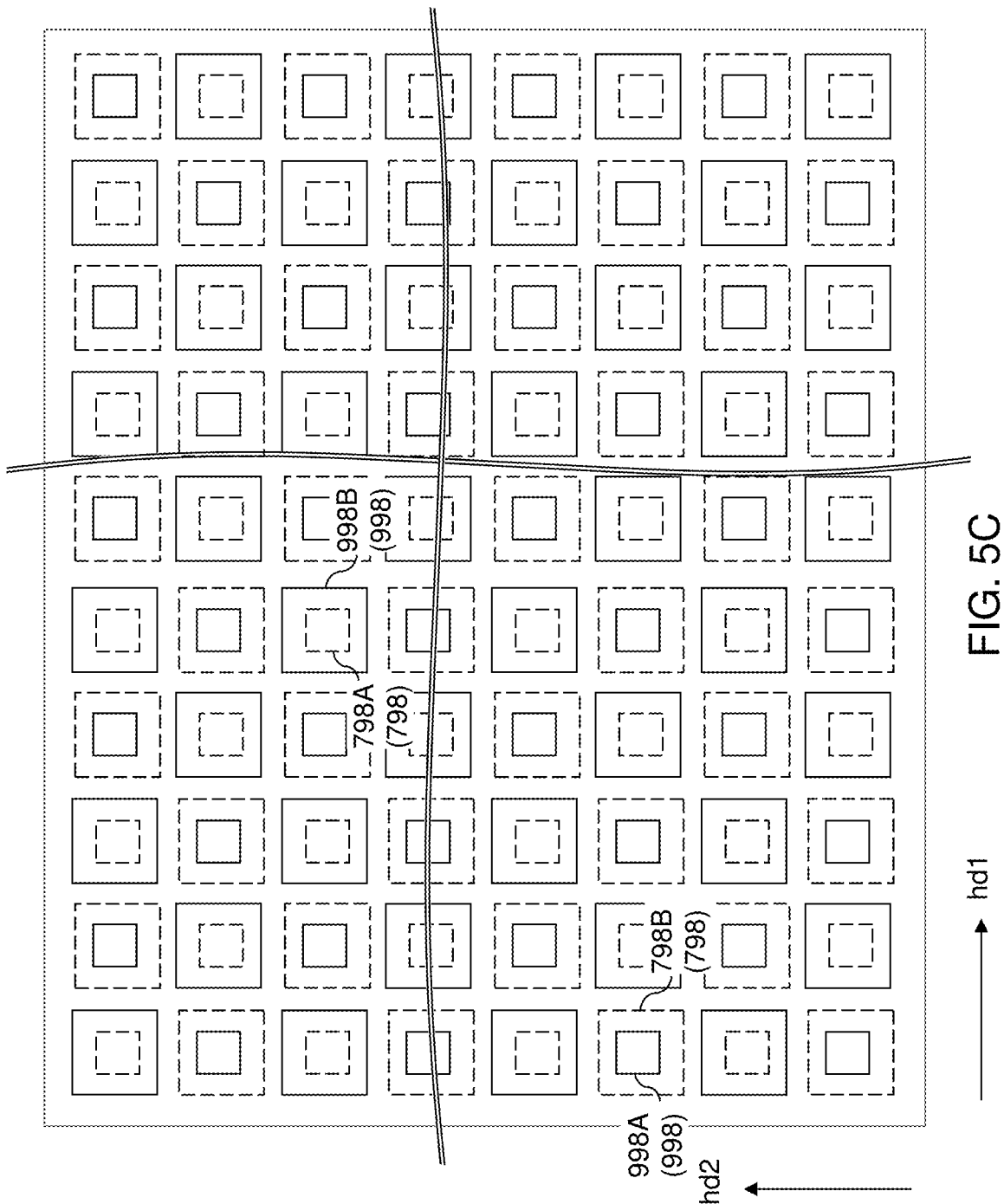
FIG. 5C is a plan view illustrating the arrangement of the primary bonding pads and the complementary bonding pads at a bonding interface within the exemplary structure of FIG. 5A.

Referring to FIGS. 5A-5C, the primary semiconductor die 900 and the complementary semiconductor die 700 can be bonded to each other by wafer-to-wafer bonding, die-to-wafer bonding, or die-to-die bonding. For example, a first wafer including a plurality of the primary semiconductor dies 900 and a second wafer including a plurality of complementary semiconductor dies 700 can be aligned to each other such that the primary bonding pads 998 of each primary semiconductor die 900 face the complementary bonding pads 798 of a corresponding complementary semiconductor die 700. The primary bonding surface 999 of the first semiconductor die 900 is bonded to a complementary bonding surface 799 of the second semiconductor die 700 to form a bonding interface 800 therebetween. Each facing pair of a primary bonding pad 998 and a complementary bonding pads 798 can be aligned to maximize the areal overlap therebetween. According to an aspect of the present disclosure, the layout of the primary bonding pads 998 and the complementary bonding pads 798 may be selected such that each first primary bonding pad 998A faces a respective first complementary bonding pad 798B, and each second primary bonding pad 998B faces a respective second complementary bonding pads 798B.

Each facing pair of a primary semiconductor die 900 and a complementary semiconductor die 700 can be brought into contact each other so that each primary bonding pad 998 contacts a respective one of the complementary bonding pads 798 with a respective areal overlap therebetween. Each first complementary bonding pad 798B can have the third area that is larger than the first area of each first primary bonding pad 998A, and each second primary bonding pad 998B can have the second area that is larger than the fourth area of each second complementary bonding pad 798B. In one embodiment, the layout of the primary bonding pads 998 and the complementary bonding pads 798 can be selected such that, upon alignment of the primary semiconductor die 900 and the complementary semiconductor die 700 with each other, the area of each of the first primary bonding pad 998A is located entirely within the area of a respective one of the first complementary bonding pad 798A in a plan view (such as the view of FIG. 5C) along a direction that is perpendicular to facing surfaces of the first semiconductor die 900 and the second semiconductor die 700, and the area of each of the second complementary bonding pad 798B is located entirely within the area of a respective one of the second primary bonding pad 998B in the plan view.

The assembly of the primary semiconductor die 900 and the complementary semiconductor die 700 are annealed at an elevated temperature in a range from 250 degrees Celsius to 400 degrees Celsius to induce metal diffusion across each interface between facing pairs of a respective primary bonding pad 998 and a respective complementary bonding pad 798. The duration of the anneal process at the elevated temperature can be in a range from 5 minutes to 2 hours, although shorter or longer anneal duration may also be employed. Each facing pair of a primary bonding pad 998 and a complementary bonding pad 798 is bonded to each other during the anneal process at the elevated temperature. A bonded assembly including the primary semiconductor die 900 and the complementary semiconductor die 700 can be formed.

The first complementary bonding pads 798A are bonded to a respective one of the first primary bonding pads 998A, and second complementary bonding pads 798B are bonded to a respective one of the second primary bonding pads 998B. As illustrated in FIG. 5C, each metal-to-metal bonding interface between first mating pairs of a respective first primary bonding pad 998A and a respective first complementary bonding pad 798A has a respective periphery that is laterally offset inward from a periphery of a bonding surface of the respective first complementary bonding pad 798A after the complementary semiconductor die 700 is bonded to the primary semiconductor die 900. Each metal-to-metal bonding interface between second mating pairs of a respective second primary bonding pad 998B and a respective second complementary bonding pad 798B has a respective periphery that is laterally offset inward from a periphery of a bonding surface of the respective second primary bonding pad 998B after the complementary semiconductor die 700 is bonded to the primary semiconductor die 900.

In one embodiment, a peripheral portion of the bonding surface of the respective first complementary bonding pad 798A is in direct contact with the first dielectric material layers (such as the primary pad-level dielectric layer 990 or the primary planarization dielectric liner 992) after the complementary semiconductor die 700 is bonded to the primary semiconductor die 900. In one embodiment, a peripheral portion of the bonding surface of the respective second primary bonding pad 998B is in direct contact with the second dielectric material layers (such as the complementary pad-level dielectric layer 790 or the complementary planarization dielectric liner 792) after the complementary semiconductor die 700 is bonded to the primary semiconductor die 900.

In one embodiment, a first contact area between the peripheral portion of the bonding surface of the respective first complementary bonding pad 798A and the first dielectric material layers (such as the primary pad-level dielectric layer 990 or the primary planarization dielectric liner 992) has a first opening therethrough after the complementary semiconductor die 700 is bonded to the primary semiconductor die 900. The first opening can have the same area as the metal-to-metal bonding interface between the respective first primary bonding pad 998A and the respective first complementary bonding pad 798A. A second contact area between the peripheral portion of the bonding surface of the respective second primary bonding pad 998A and the second dielectric material layers (such as the complementary pad-level dielectric layer 790 or the complementary planarization dielectric liner 792) has a second opening therethrough after the complementary semiconductor die 700 is bonded to the primary semiconductor die 900. The second opening can have same area as the metal-to-metal bonding interface between the respective second primary bonding pad 998B and the respective second complementary bonding pad 798B.

In one embodiment, the primary bonding pads 998 are arranged in at least one primary-side row in which a respective subset of the first primary bonding pads 998A alternates with a respective subset of the second primary bonding pads 998B along a horizontal direction (such as the first horizontal direction hd1), and the complementary bonding pads 798 are arranged in at least one complementary-side row in which a respective subset of the first complementary bonding pads 798A alternates with a respective subset of the second complementary bonding pads 798B along the horizontal direction.

Figure 6:
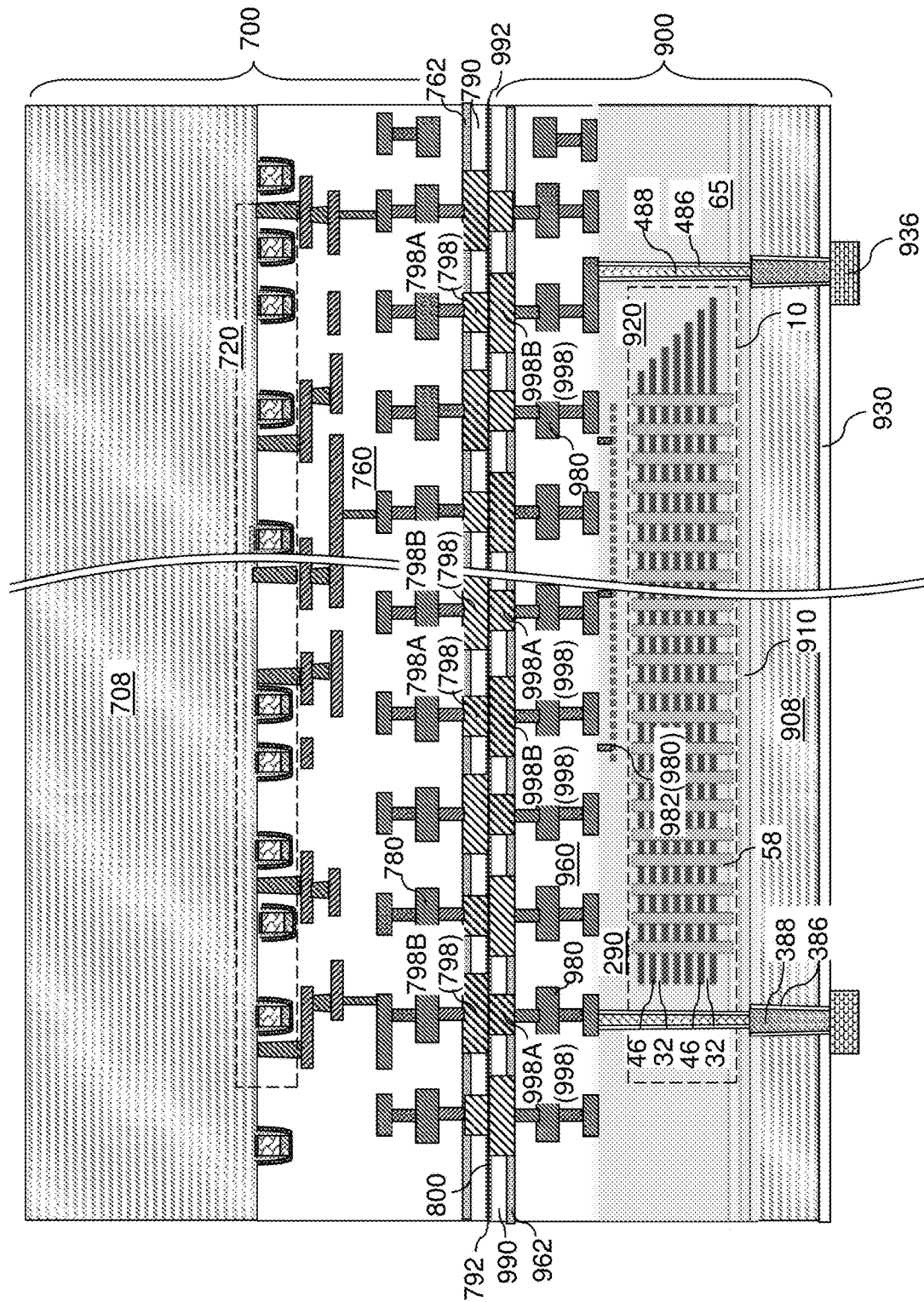
FIG. 6 is a vertical cross-sectional view of the exemplary structure after thinning the backside of the first substrate and formation of backside bonding pads according to an embodiment of the present disclosure.

Referring to FIG. 6, in one embodiment, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be employed.

A backside insulating layer 930 may be formed on the backside of the first substrate 908. The backside insulating layer 930 includes an insulating material such as silicon oxide. The thickness of the backside insulating layer 930 can be in a range from 50 nm to 500 nm, although lesser and greater thicknesses can also be employed. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 936 contacting a respective one of the through-substrate via structures 388. The backside bonding pads 936 can function as external bonding pads that can be employed to electrically connect various nodes of within the primary semiconductor die 900 and the complementary semiconductor die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Figure 7A:
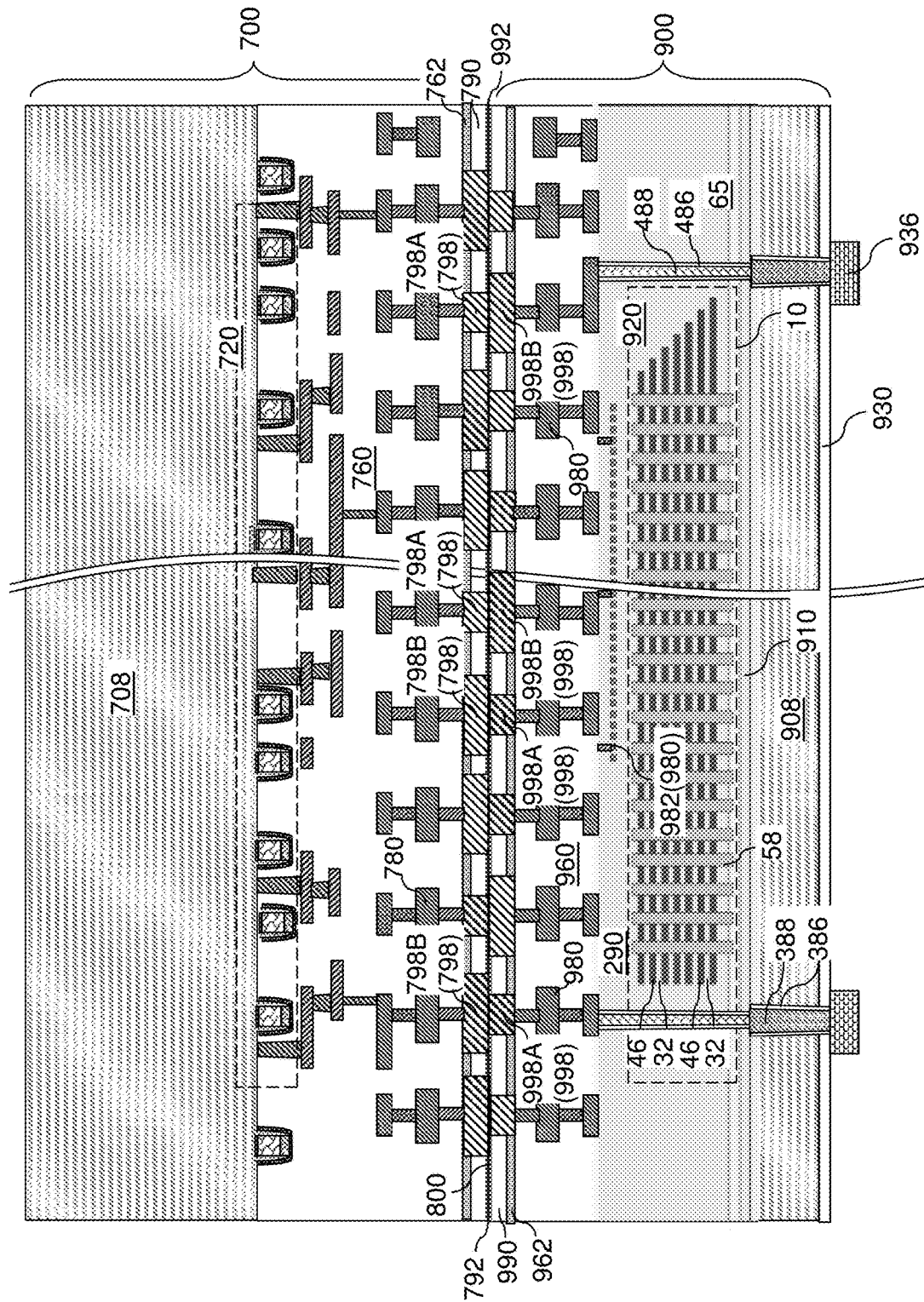
FIG. 7A is a vertical cross-sectional view of a first alternative configuration of the exemplary structure according to an embodiment of the present disclosure.

Referring to FIG. 7A, a first alternative configuration of the exemplary structure can be derived from the exemplary structure illustrated in FIG. 6 by altering the arrangement of the first mating pairs of a respective first primary bonding pad 998A and a respective first complementary bonding pad 798A and second mating pairs of a respective second primary bonding pad 998B and a respective second complementary bonding pad 798B. In this case, the pattern of alternation of the first mating pairs and the second mating pairs within each row of mating pairs as provided in the exemplary structure of FIG. 6 may be modified such that a unit of repetition within each row of mating pairs of a respective primary bonding pad 998 and a respective complementary bonding pad 798 includes two first mating pairs of a respective first primary bonding pad 998A and a respective first complementary bonding pad 798A and a single second mating pair of a respective second primary bonding pad 998B and a respective second complementary bonding pad 798B, or a single first mating pair of a respective first primary bonding pad 998A and a respective first complementary bonding pad 798A and two second mating pairs of a respective second primary bonding pad 998B and a respective second complementary bonding pad 798B.

Figure 7B:
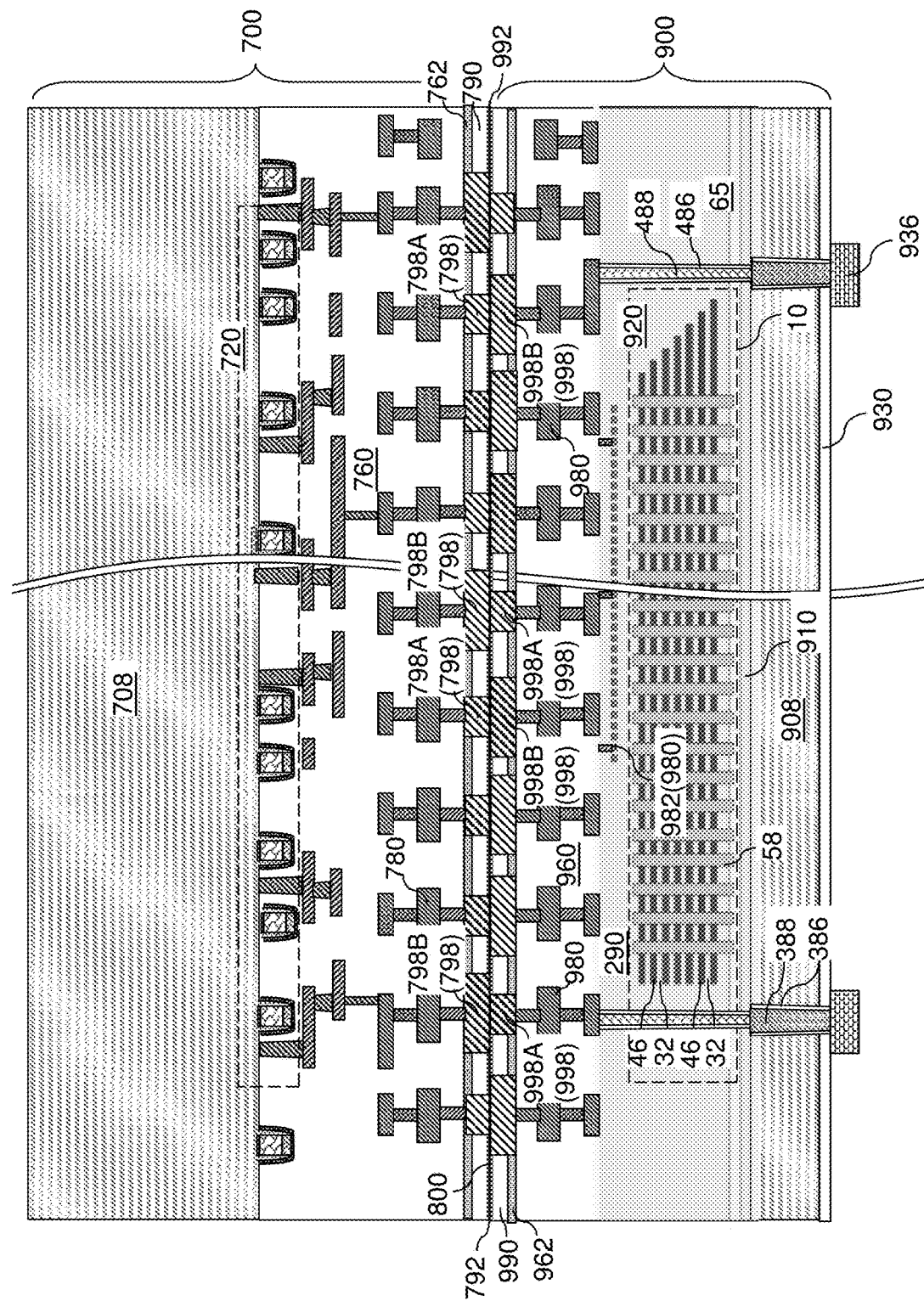
FIG. 7B is a vertical cross-sectional view of a second alternative configuration of the exemplary structure according to an embodiment of the present disclosure.

Referring to FIG. 7B, a second alternative configuration of the exemplary structure can be derived from the exemplary structure illustrated in FIG. 6 by altering the arrangement of the first mating pairs of a respective first primary bonding pad 998A and a respective first complementary bonding pad 798A and second mating pairs of a respective second primary bonding pad 998B and a respective second complementary bonding pad 798B. In this case, the pattern of alternation of the first mating pairs and the second mating pairs within each row of mating pairs as provided in the exemplary structure of FIG. 6 may be modified such that a unit of repetition within each row of mating pairs of a respective primary bonding pad 998 and a respective complementary bonding pad 798 includes three first mating pairs of a respective first primary bonding pad 998A and a respective first complementary bonding pad 798A and a single second mating pair of a respective second primary bonding pad 998B and a respective second complementary bonding pad 798B, or a single first mating pair of a respective first primary bonding pad 998A and a respective first complementary bonding pad 798A and three second mating pairs of a respective second primary bonding pad 998B and a respective second complementary bonding pad 798B.

Figure 8B:
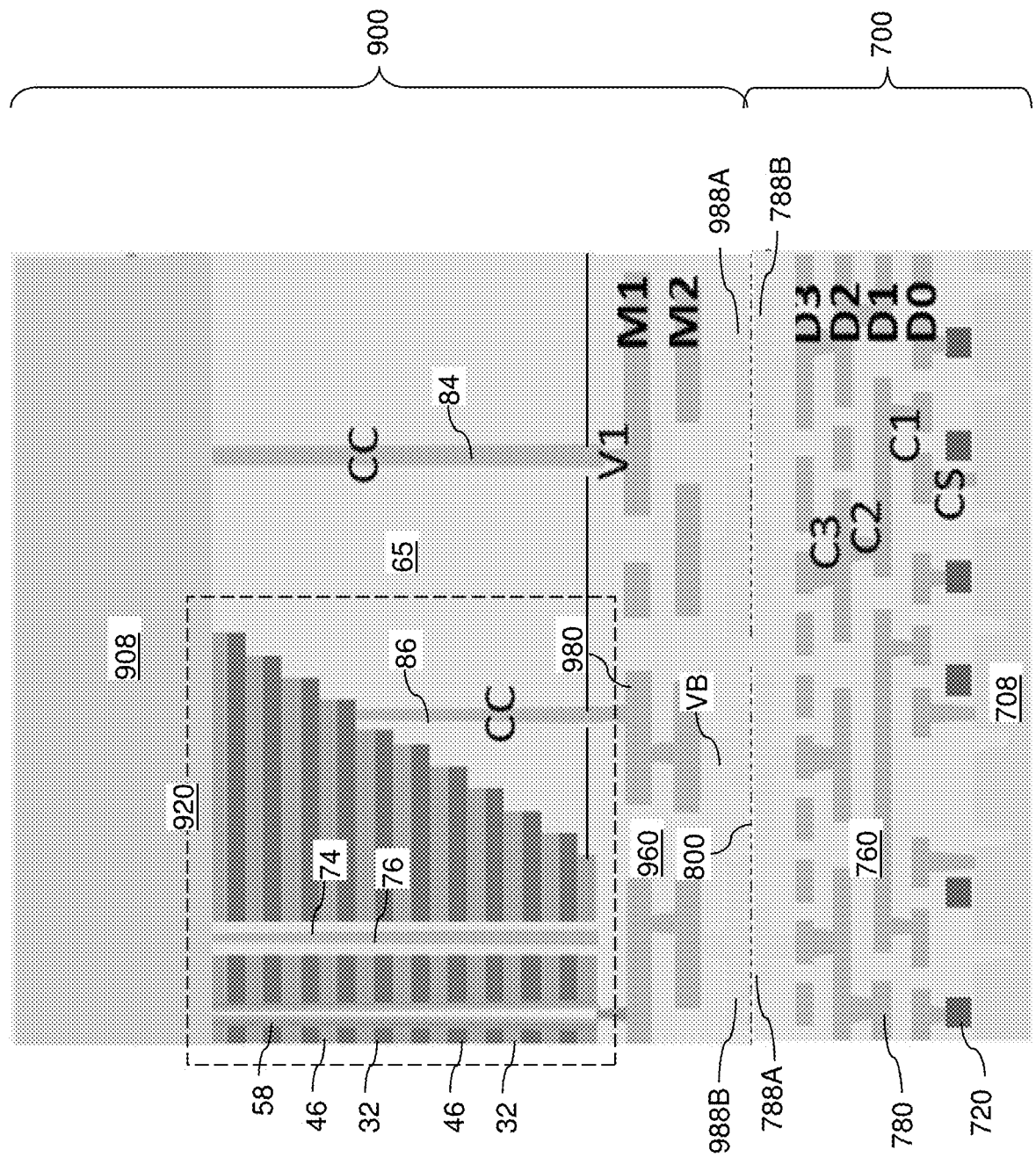
Figure 8C:
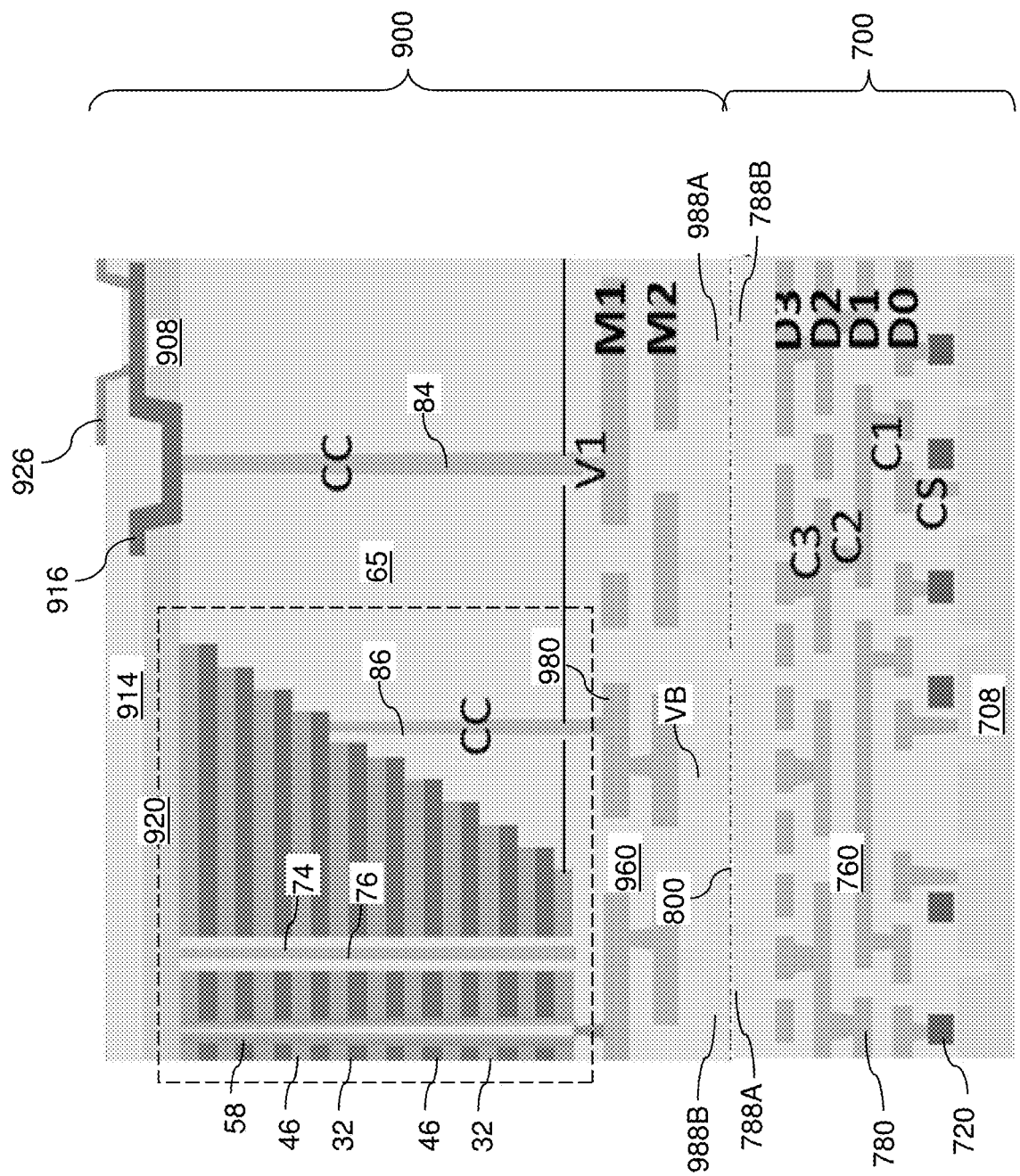

FIGS. 8A-8C are sequential vertical cross-sectional views of a second exemplary structure during formation of a bonded assembly according to an embodiment of the present disclosure. Generally, the second exemplary structure can be derived from the first exemplary structure or alternative configurations thereof by forming through-memory-level via structures 84 through the stepped dielectric material portions 65. Openings can be formed through the thinned first substrate 908 in areas that overlie the through-memory-level via structures 84. Connection plates 916 can be formed on a respective one of the through-memory-level via structures 84 within a respective opening through the thinned first substrate 908. A backside insulating layer 914 can be formed over the thinned first substrate 908 and the connection plates 908. Openings can be formed through the backside insulating layer 914. Backside bonding pads 926 can be formed on a respective one of the connection plates in a respective opening in the backside insulating layer 914.

Figure 9A:
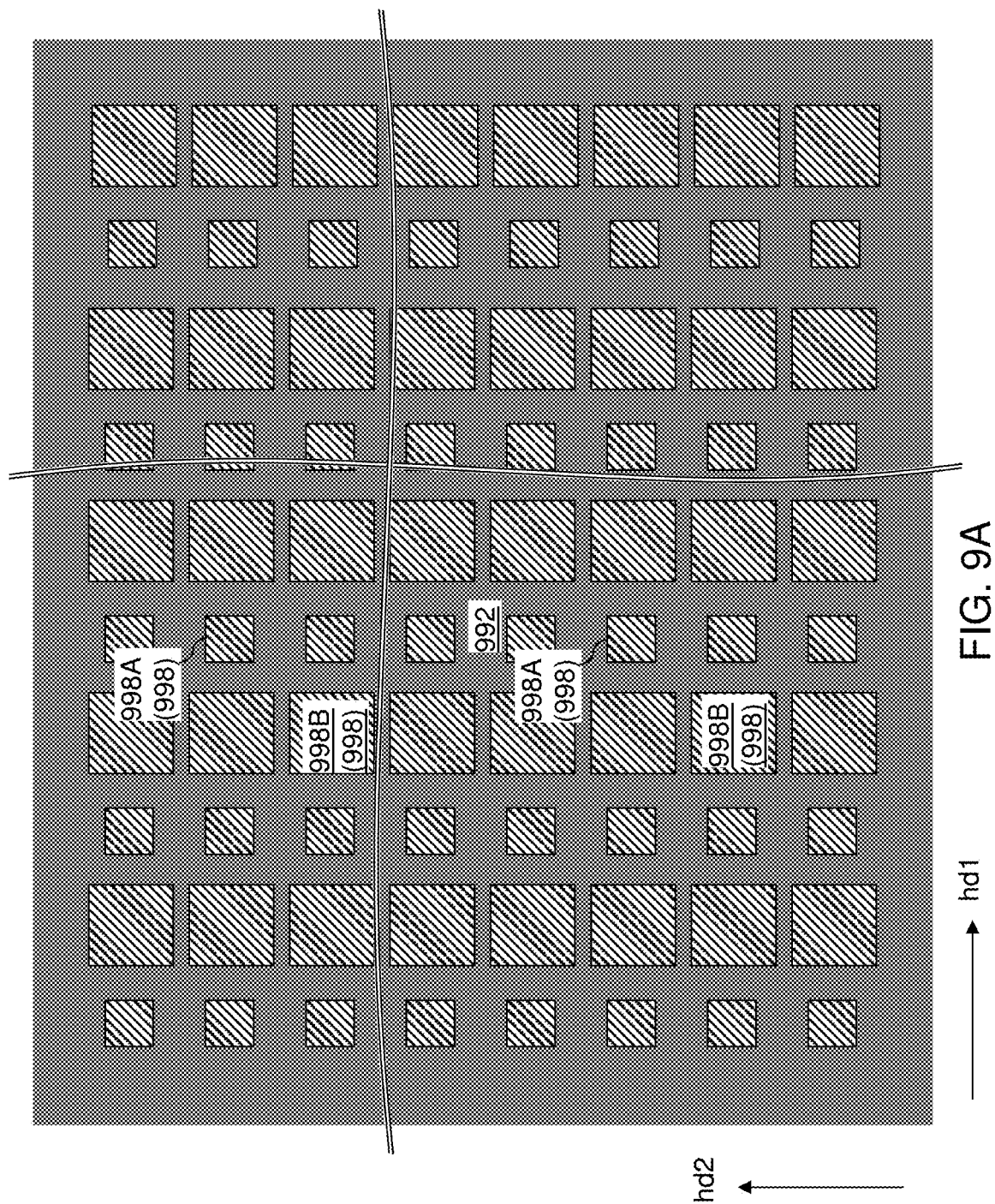
FIG. 9A is a top-down view of an alternative configuration of primary bonding pads according to an embodiment of the present disclosure.
Figure 9B:
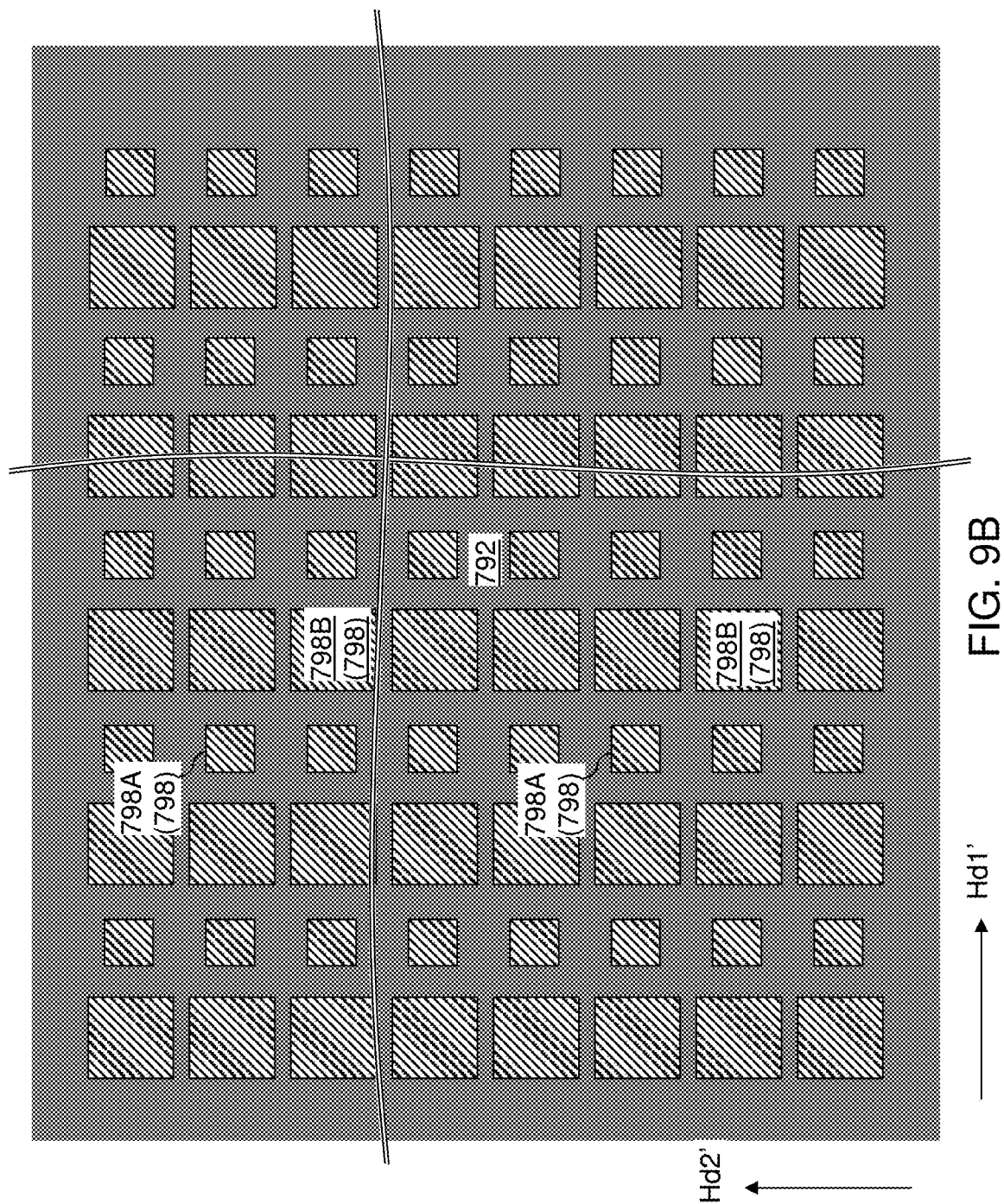
FIG. 9B is a top-down view of an alternative configuration of complementary bonding pads according to an embodiment of the present disclosure.
Figure 9C:
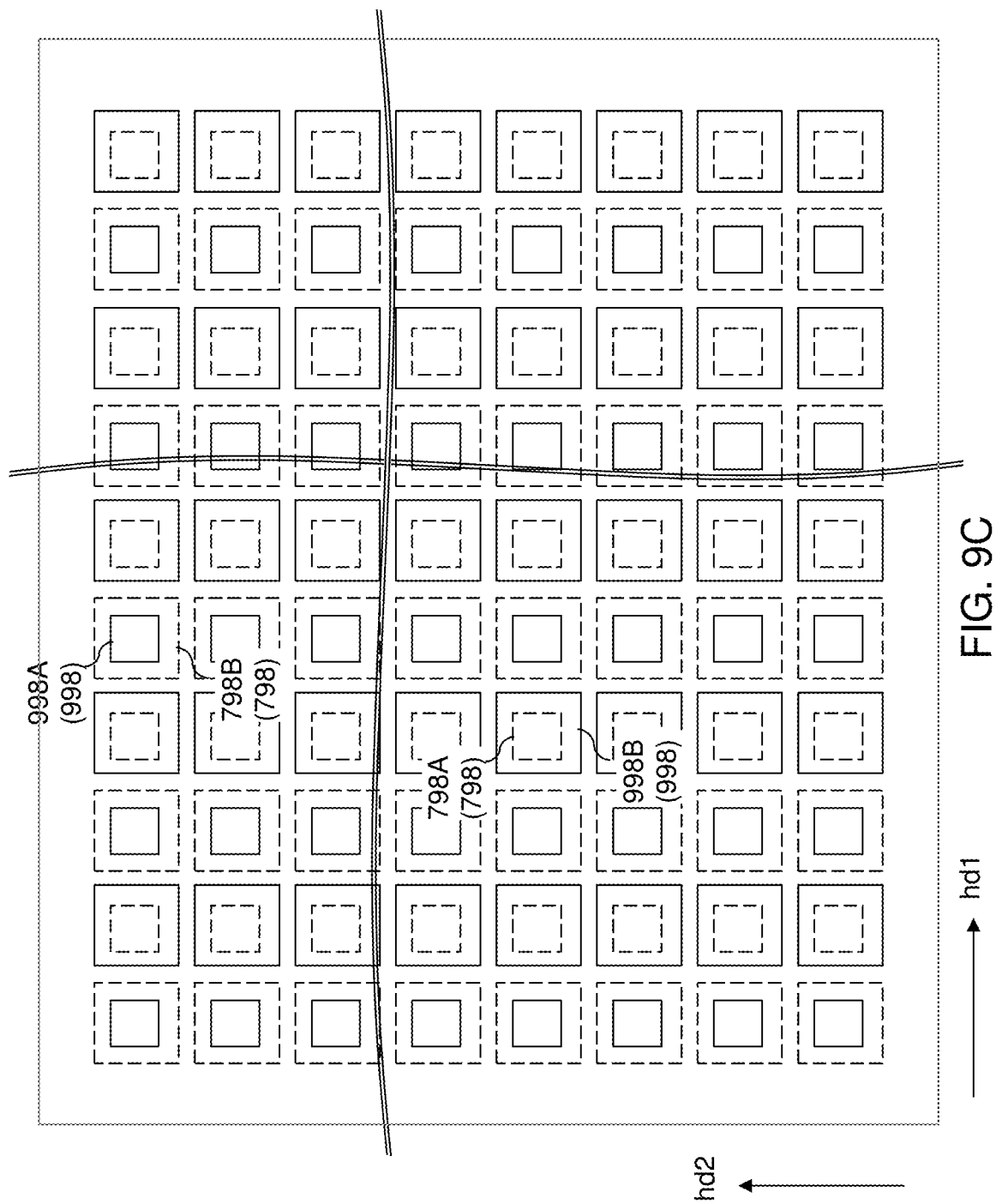
FIG. 9C is a plan view illustrating the arrangement of the primary bonding pads and the complementary bonding pads at a bonding interface within an alternative configuration of the exemplary structure that employs the configurations illustrated in FIGS. 9A and 9B.

FIGS. 9A-9C illustrate yet another alternative configuration of the bonding pads (998, 798) that may be employed to implement an embodiment of the present disclosure. FIG. 9A is a top-down view of an alternative configuration of primary bonding pads 998 according to an embodiment of the present disclosure. FIG. 9B is a top-down view of an alternative configuration of complementary bonding pads 798 according to an embodiment of the present disclosure. FIG. 9C is a plan view illustrating the arrangement of the primary bonding pads 998 and the complementary bonding pads 798 at a bonding interface within the alternative configuration of the exemplary structure.

In this illustrated example, the first primary bonding pads 998A and the second primary bonding pads 998B alternate along the first horizontal direction hd1 within each row of primary bonding pads 998 arranged along the first horizontal direction hd1 as illustrated in FIG. 9A. Patterns of multiple rows of primary bonding pads 998 are aligned along the second horizontal direction hd2. Thus, the lateral offset along the first horizontal direction hd1 between neighboring rows of primary bonding pads 998 (each of which is arranged along the first horizontal direction hd1) is zero.

Likewise, the first complementary bonding pads 798A and the second complementary bonding pads 998B alternate along the first horizontal direction hd1' within each row of primary bonding pads 998 arranged along the first horizontal direction hd1' as illustrated in FIG. 9B. Patterns of multiple rows of complementary bonding pads 798 are aligned along the second horizontal direction hd2'. Thus, the lateral offset along the first horizontal direction hd1' between neighboring rows of complementary bonding pads 798 (each of which is arranged along the first horizontal direction hd1') is zero.

Prior to bonding the complementary semiconductor die 700 to the primary semiconductor die 900, the first horizontal direction hd1' of the complementary semiconductor die 700 is aligned to the first horizontal direction hd1 of the primary semiconductor die 900, and the second horizontal direction hd2' of the complementary semiconductor die 700 is aligned to the second horizontal direction hd2 of the primary semiconductor die 900.

Each facing pair of a primary semiconductor die 900 and a complementary semiconductor die 700 can be brought into contact each other so that each primary bonding pad 998 contacts a respective one of the complementary bonding pads 798 with a respective areal overlap therebetween. Each first complementary bonding pad 798B can have the third area that is larger than the first area of each first primary bonding pad 998A, and each second primary bonding pad 998B can have the second area that is larger than the fourth area of each second complementary bonding pad 798B. In one embodiment, the layout of the primary bonding pads 998 and the complementary bonding pads 798 can be selected such that, upon alignment of the primary semiconductor die 900 and the complementary semiconductor die 700 with each other, the area of each of the first primary bonding pad 998A is located entirely within the area of a respective one of the first complementary bonding pad 798A in a plan view (such as the view of FIG. 9C) along a direction that is perpendicular to facing surfaces of the first semiconductor die 900 and the second semiconductor die 700, and the area of each of the second complementary bonding pad 798B is located entirely within the area of a respective one of the second primary bonding pad 998B in the plan view.

Figure 10A:
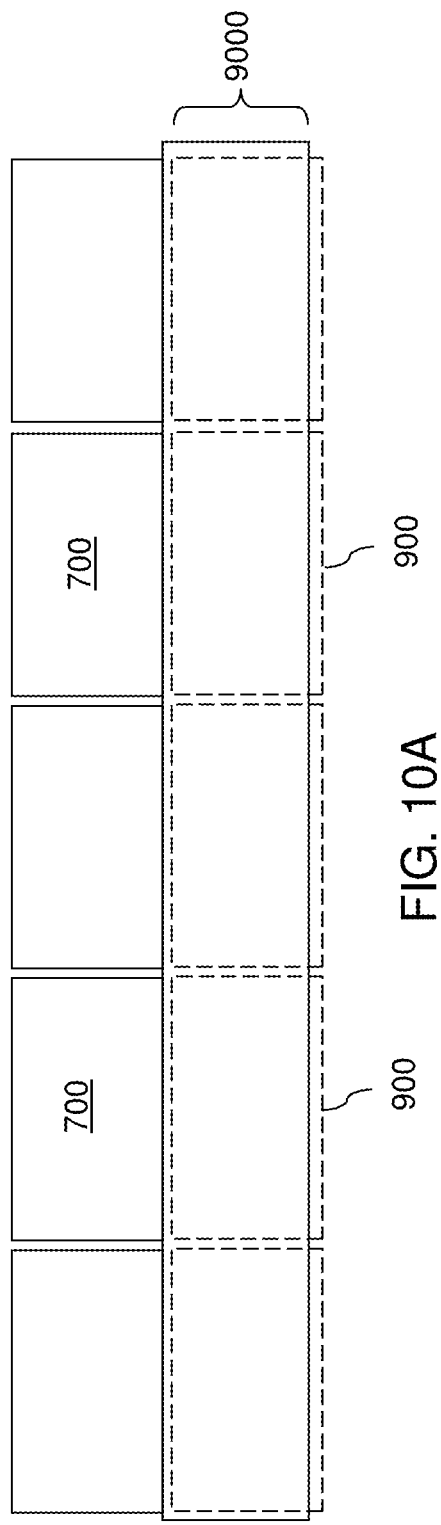
FIG. 10A is a vertical cross-sectional view of an exemplary bonded structure formed employing a first die-to-wafer bonding scheme.

Referring to FIG. 10A, a first die-to-wafer bonding scheme is illustrated, in which the complementary semiconductor dies 700 are singulated from a wafer, and are individually bonded to a respective primary semiconductor die 900 within a wafer 9000 including a two-dimensional array of primary semiconductor dies 900.

Figure 10B:
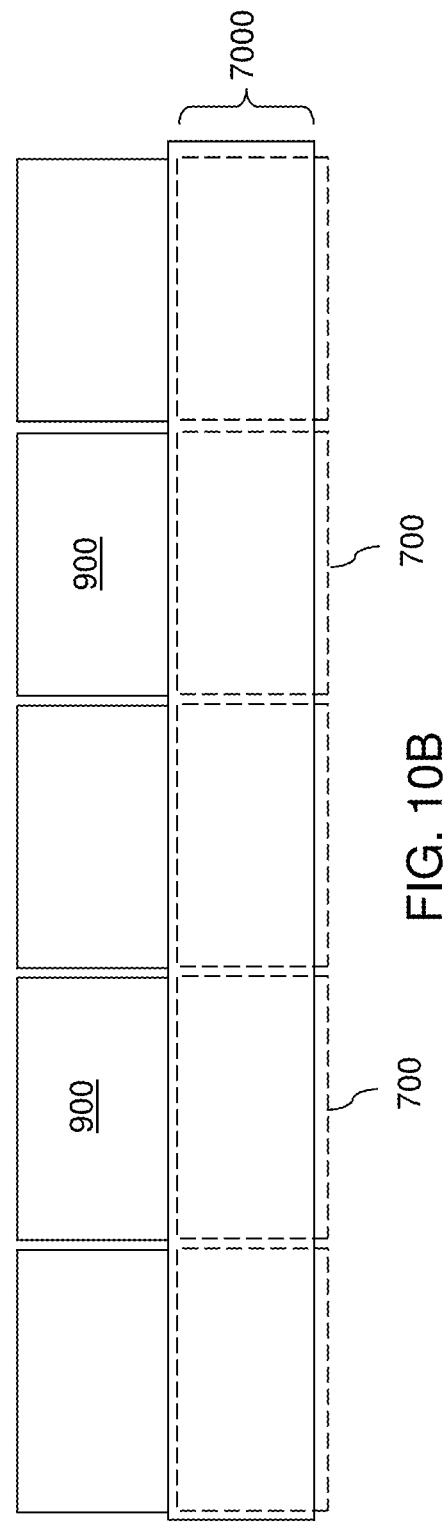
FIG. 10B is a vertical cross-sectional view of an exemplary bonded structure formed employing a second die-to-wafer bonding scheme.

Referring to FIG. 10B, a second die-to-wafer bonding scheme is illustrated, in which the primary semiconductor dies 900 are singulated from a wafer, and are individually bonded to a respective complementary semiconductor die 700 within a wafer 7000 including a two-dimensional array of complementary semiconductor dies 700.

Figure 10C:
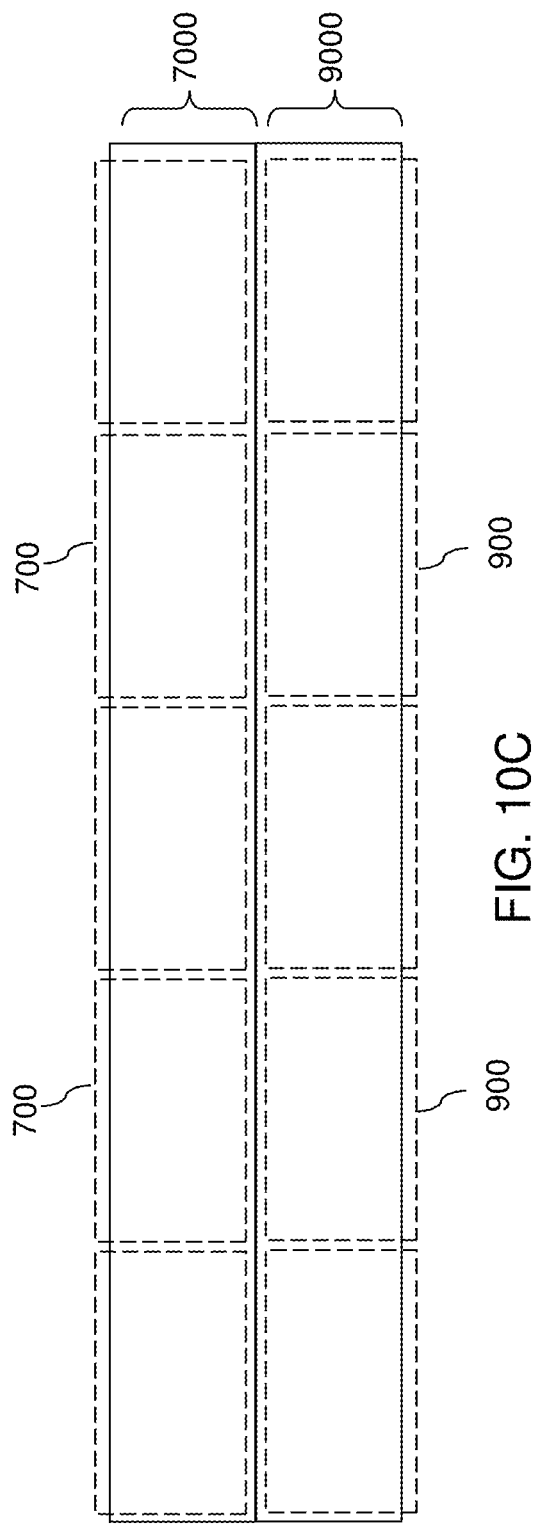
FIG. 10C is a vertical cross-sectional view of an exemplary bonded structure formed employing a wafer-to-wafer bonding scheme.

Referring to FIG. 10C, a wafer-to-wafer bonding scheme is illustrated, in which a first wafer 9000 including a two-dimensional array of primary semiconductor dies 900 is bonded to a second wafer 7000 including a two-dimensional array of complementary semiconductor dies 700. In this case, all complementary semiconductor dies 700 may be simultaneously bonded to a respective one of the primary semiconductor dies 900.

Figure 10D:
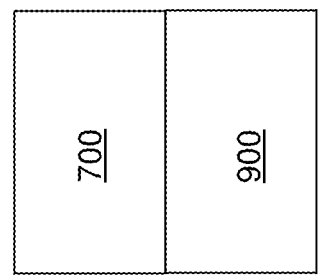
FIG. 10D is a vertical cross-sectional view of an exemplary bonded structure formed employing a die-to-die bonding scheme.

Referring to FIG. 10D, a die-to-die bonding scheme is illustrated, in which a complementary semiconductor die 700 as singulated from a wafer is bonded to a primary semiconductor die 900 that is singulated from another wafer.

The various embodiments of the present disclosure may provide a low maximum local copper bonding pad area density, such as a maximum local copper bonding pad area density of less than 25%, such as a percentage in a range from 15% to 20%, on each of the bonding surfaces (999, 799) of the primary semiconductor die 900 and the complementary semiconductor die 700. Limiting the maximum local copper density below a certain level (such as 25%) provides high quality hybrid bonding between two semiconductor dies that employs both metal-to-metal bonding and dielectric-to-dielectric bonding and optional metal-to-dielectric bonding. The various structures and methods of the embodiments of the present disclosure can provide arrangements in which smaller bonding pads and large bonding pads alternate along at least one direction, and thus, provides a reduction of the maximum local copper bonding pad density. This permits scaling of the bonding pads while minimizing adverse effects associated with high local copper bonding pad densities.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a primary semiconductor die comprising first semiconductor devices and primary bonding pads; and
a complementary semiconductor die comprising second semiconductor devices and complementary bonding pads,
wherein:
the primary bonding pads comprise first primary bonding pads and second primary bonding pads having a larger bonding area than the first primary bonding pads;
the complementary bonding pads comprise first complementary bonding pads and second complementary bonding pads having a smaller bonding area than the first complementary bonding pads;
the first complementary bonding pads are bonded to a respective one of the first primary bonding pads; and
the second complementary bonding pads are bonded to a respective one of the second primary bonding pads.

2. The bonded assembly of claim 1, wherein:
each of the first primary bonding pads has a first bonding area;
each of the second primary bonding pads has a second bonding area larger than the first area;
each of the first complementary bonding pads has a third bonding area larger than the first area; and
each of the second complementary bonding pads has a fourth bonding area smaller than the second and the third bonding areas.

3. The bonded assembly of claim 1, wherein:
a ratio of the third bonding area to the first bonding area is in a range from 1.2 to 4; and
a ratio of the second bonding area to the fourth bonding area is in a range from 1.2 to 4.

4. The bonded assembly of claim 3, wherein:
a ratio of the first bonding area to the fourth bonding area is in a range from 0.5 to 2; and
a ratio of the third bonding area to the second bonding area is in a range from 0.5 to 2.

5. The bonded assembly of claim 1, wherein:
each metal-to-metal bonding interface between first mating pairs of a respective first primary bonding pad of the first primary bonding pads and a respective first complementary bonding pad of the first complementary bonding pads has a respective periphery that is laterally offset inward from a periphery of a bonding surface of the respective first complementary bonding pad; and
each metal-to-metal bonding interface between second mating pairs of a respective second primary bonding pad of the second primary bonding pads and a respective second complementary bonding pad of the second complementary bonding pads has a respective periphery that is laterally offset inward from a periphery of a bonding surface of the respective second primary bonding pad.

6. The bonded assembly of claim 5, wherein:
first dielectric material layers that embed first metal interconnect structures are located over the first semiconductor devices;
the primary bonding pads are located on the first dielectric material layers;
second dielectric material layers that embed second metal interconnect structures are located over the second semiconductor devices; and
the complementary bonding pads are located on the second dielectric material layers.

7. The bonded assembly of claim 6, wherein:
a peripheral portion of the bonding surface of the respective first complementary bonding pad is in direct contact with the first dielectric material layers;
a peripheral portion of the bonding surface of the respective second primary bonding pad is in direct contact with the second dielectric material layers;
a primary bonding surface of the first semiconductor die is bonded to a complementary bonding surface of the second semiconductor die;
the primary bonding pads occupy less than 25% of the primary bonding surface; and
the complementary bonding pads occupy less than 25% of the complementary bonding surface.

8. The bonded assembly of claim 6, wherein:
the primary bonding pads are arranged in at least one primary-side row in which a respective subset of the first primary bonding pads alternates with a respective subset of the second primary bonding pads along a first horizontal direction; and
the complementary bonding pads are arranged in at least one complementary-side row in which a respective subset of the first complementary bonding pads alternates with a respective subset of the second complementary bonding pads along the first horizontal direction.

9. The bonded assembly of claim 8, wherein:
the at least one primary-side row comprises multiple primary-side rows that are laterally spaced apart along a second horizontal direction;
the at least one complementary-side row comprises multiple complementary-side rows that are laterally spaced apart along the second horizontal direction;
each of the multiple primary-side rows has a first pitch along the first horizontal direction;
each of the multiple complementary-side row has the first pitch along the first horizontal direction.

10. The bonded assembly of claim 9, wherein:
a pattern of each primary-side row among the multiple primary-side rows is laterally offset along the first horizontal direction by one half of the first pitch relative to a respective most proximal primary-side row among the multiple primary-side rows; and
a pattern of each complementary-side row among the multiple complementary-side rows is laterally offset along the first horizontal direction by one half of the first pitch relative to a respective most proximal complementary-side row among the multiple complementary-side rows.

11. The bonded assembly of claim 1, wherein:
the first primary bonding pads are arranged in a first two-dimensional periodic array having a first pitch along a first horizontal direction and having a second pitch along a second horizontal direction;
the second primary bonding pads are arranged in a second two-dimensional periodic array having the first pitch along the first horizontal direction and having the second pitch along the second horizontal direction; and
a geometrical center of each of the second primary bonding pads is laterally offset from a geometrical center of a respective most proximal one of the first primary bonding pads by one half of the first pitch along the first horizontal direction and by one half of the second pitch along the second horizontal direction.

12. The bonded assembly of claim 1, wherein:
the primary semiconductor die comprises a memory die including a three-dimensional array of memory elements; and
the complementary semiconductor die comprises a logic die including a peripheral circuitry configured to control operation of the three-dimensional array of memory elements.

13. A bonded assembly, comprising:
a primary semiconductor die;
a complementary semiconductor die;
first pairs of bonded first primary bonding pads and first complementary bonding pads that are larger in area than the first primary bonding pads; and
second pairs of bonded second primary bonding pads and second complementary bonding pads that are smaller in area than the second primary bonding pads.

14. A method of forming a bonded assembly, comprising:
providing a primary semiconductor die, wherein the primary semiconductor die comprises first semiconductor devices and primary bonding pads, wherein the primary bonding pads comprise first primary bonding pads and second primary bonding pads having a larger bonding area than the first bonding pads;
providing a complementary semiconductor die, wherein the complementary semiconductor die comprises second semiconductor devices and complementary bonding pads, wherein the complementary bonding pads comprise first complementary bonding pads and second complementary bonding pads having a smaller bonding area than the first complementary bonding pads; and
bonding the complementary semiconductor die to the primary semiconductor die such that the first complementary bonding pads are bonded to a respective one of the first primary bonding pads and the second complementary bonding pads are bonded to a respective one of the second primary bonding pads.

15. The method of claim 14, wherein:
the first complementary bonding pads have a greater bonding area than the bonding area the first primary bonding pads; and
the second complementary bonding pads have a smaller bonding area that the second bonding pads.

16. The method of claim 14, wherein:
each metal-to-metal bonding interface between first mating pairs of a respective first primary bonding pad of the first primary bonding pads and a respective first complementary bonding pad of the first complementary bonding pads has a respective periphery that is laterally offset inward from a periphery of a bonding surface of the respective first complementary bonding pad after the complementary semiconductor die is bonded to the primary semiconductor die; and
each metal-to-metal bonding interface between second mating pairs of a respective second primary bonding pad of the second primary bonding pads and a respective second complementary bonding pad of the second complementary bonding pads has a respective periphery that is laterally offset inward from a periphery of a bonding surface of the respective second primary bonding pad after the complementary semiconductor die is bonded to the primary semiconductor die.

17. The method of claim 16, wherein:
a peripheral portion of the bonding surface of the respective first complementary bonding pad is in direct contact with the first dielectric material layers after the complementary semiconductor die is bonded to the primary semiconductor die; and
a peripheral portion of the bonding surface of the respective second primary bonding pad is in direct contact with the second dielectric material layers after the complementary semiconductor die is bonded to the primary semiconductor die.

18. The method of claim 14, wherein:
first dielectric material layers that embed first metal interconnect structures are located over the first semiconductor devices;
the primary bonding pads are located on the first dielectric material layers;
second dielectric material layers that embed second metal interconnect structures are located over the second semiconductor devices; and
the complementary bonding pads are located on the second dielectric material layers.

19. The method of claim 18, wherein:
a primary bonding surface of the first semiconductor die is bonded to a complementary bonding surface of the second semiconductor die;
the primary bonding pads occupy less than 25% of the primary bonding surface; and
the complementary bonding pads occupy less than 25% of the complementary bonding surface.

20. The method of claim 14, wherein:
the primary bonding pads are arranged in at least one primary-side row in which a respective subset of the first primary bonding pads alternates with a respective subset of the second primary bonding pads along a horizontal direction; and
the complementary bonding pads are arranged in at least one complementary-side row in which a respective subset of the first complementary bonding pads alternates with a respective subset of the second complementary bonding pads along the horizontal direction.

* * * * *